(12) United States Patent
Watanabe et al.

(10) Patent No.: US 11,100,855 B2
(45) Date of Patent: Aug. 24, 2021

(54) DISPLAY DEVICE AND ELECTRONIC DEVICE

(71) Applicant: Semiconductor Energy Laboratory Co., Ltd., Kanagawa-ken (JP)

(72) Inventors: Kazunori Watanabe, Tokyo (JP); Kei Takahashi, Kanagawa (JP); Susumu Kawashima, Kanagawa (JP); Kouhei Toyotaka, Kanagawa (JP); Koji Kusunoki, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/772,912

(22) PCT Filed: Dec. 19, 2018

(86) PCT No.: PCT/IB2018/060298
§ 371 (c)(1),
(2) Date: Jun. 15, 2020

(87) PCT Pub. No.: WO2019/123288
PCT Pub. Date: Jun. 27, 2019

(65) Prior Publication Data
US 2020/0312238 A1    Oct. 1, 2020

(30) Foreign Application Priority Data
Dec. 22, 2017   (JP) .............................. JP2017-245985

(51) Int. Cl.
*G09G 3/36*     (2006.01)
*G09G 5/00*     (2006.01)
(Continued)

(52) U.S. Cl.
CPC .......... *G09G 3/3225* (2013.01); *G09G 3/3648* (2013.01); *H01L 27/1225* (2013.01);
(Continued)

(58) Field of Classification Search
CPC ... G09G 3/32; G09G 3/36; G09G 5/00; G06F 3/038
See application file for complete search history.

(56) References Cited

U.S. PATENT DOCUMENTS 6,563,480 B1   5/2003   Nakamura
6,853,370 B2   2/2005   Numao
(Continued)

FOREIGN PATENT DOCUMENTS

CN   001365093 A   8/2002
CN   102654979 A   9/2012
(Continued)

OTHER PUBLICATIONS

International Search Report (Application No. PCT/IB2018/060298) dated Apr. 9, 2019.
(Continued)

*Primary Examiner* — Pegeman Karimi
(74) *Attorney, Agent, or Firm* — Husch Blackwell LLP

(57) ABSTRACT

A display device capable of improving image quality is provided.

A first pixel circuit and a second pixel circuit are included; a memory node is provided in each pixel circuit and a first signal can be retained in the memory node. The first signal is added to a second signal by capacitive coupling, and then can be supplied to a display element. Thus, the display device can display a corrected image. Furthermore, the first pixel circuit and the second pixel circuit share a signal line, whereby the aperture ratio of a pixel can be increased.

18 Claims, 24 Drawing Sheets

(51) Int. Cl.
*G09G 3/3225* (2016.01)
*H01L 27/12* (2006.01)
*G02F 1/1368* (2006.01)
*H01L 27/32* (2006.01)

(52) U.S. Cl.
CPC ... *G02F 1/1368* (2013.01); *G09G 2300/0809* (2013.01); *H01L 27/3244* (2013.01)

(56) References Cited

U.S. PATENT DOCUMENTS

| | | | |
|---|---|---|---|
| 7,674,650 | B2 | 3/2010 | Akimoto et al. |
| 7,825,878 | B2 | 11/2010 | Kawabe |
| 8,269,697 | B2 | 9/2012 | Handa et al. |
| 8,421,716 | B2 | 4/2013 | Numao |
| 8,860,108 | B2 | 10/2014 | Yamazaki et al. |
| 8,976,090 | B2 | 3/2015 | Yamamoto et al. |
| 9,093,024 | B2 | 7/2015 | Handa et al. |
| 10,140,940 | B2 | 11/2018 | Aoki |
| 2002/0089496 | A1 | 7/2002 | Numao |
| 2008/0088561 | A1 | 4/2008 | Kawabe |
| 2009/0135323 | A1 | 5/2009 | Yang et al. |
| 2009/0141204 | A1 | 6/2009 | Numao |
| 2009/0295691 | A1 | 12/2009 | Handa et al. |
| 2012/0223978 | A1 | 9/2012 | Yamamoto et al. |
| 2012/0249509 | A1 | 10/2012 | Kim et al. |
| 2013/0082906 | A1 | 4/2013 | Toyomura et al. |
| 2014/0022289 | A1* | 1/2014 | Lee ............... G09G 3/006 345/691 |
| 2015/0317028 | A1* | 11/2015 | Takahashi ....... G06F 3/041 345/173 |
| 2016/0064424 | A1 | 3/2016 | Umezaki |
| 2017/0045787 | A1 | 2/2017 | Kita et al. |
| 2017/0162113 | A1* | 6/2017 | Lin ............... G09G 3/3233 |
| 2017/0187360 | A1* | 6/2017 | Uesugi ........... G09G 3/3696 |
| 2018/0061307 | A1* | 3/2018 | Inoue ............ G09G 3/3275 |
| 2020/0142229 | A1 | 5/2020 | Kusunoki et al. |
| 2020/0193928 | A1 | 6/2020 | Kawashima et al. |

FOREIGN PATENT DOCUMENTS

| | | |
|---|---|---|
| JP | 2002-278498 A | 9/2002 |
| JP | 2005-331891 A | 12/2005 |
| JP | 2007-096055 A | 4/2007 |
| JP | 2007-123861 A | 5/2007 |
| JP | 2009-128900 A | 6/2009 |
| JP | 2009-288734 A | 12/2009 |
| JP | 2011-119674 A | 6/2011 |
| JP | 2012-058335 A | 3/2012 |
| JP | 2012-185328 A | 9/2012 |
| JP | 2013-076812 A | 4/2013 |
| JP | 2016-177035 A | 10/2016 |
| JP | 2017-027012 A | 2/2017 |
| JP | 2019-045613 A | 3/2019 |
| JP | 2019-045614 A | 3/2019 |
| KR | 2002-0060604 A | 7/2002 |
| KR | 2009-0125703 A | 12/2009 |
| KR | 10-1043673 B1 | 6/2011 |
| TW | 581923 B | 4/2004 |
| WO | WO 2005/116971 A1 | 12/2005 |
| WO | WO 2019/030595 A1 | 2/2019 |
| WO | WO 2019/043483 A1 | 3/2019 |

OTHER PUBLICATIONS

Written Opinion (Application No. PCT/IB2018/060298) dated Apr. 9, 2019.
Amano, S. et al., "Low Power LC Display Using In—Ga—Zn—Oxide TFTs Based on Variable Frame Frequency," SID Digest '10: SID International Symposium Digest of Technical Papers, May 23, 2010, vol. 41, No. 1, pp. 626-629.
Yamazaki, S. et al., "Research, Development, and Application of Crystalline Oxide Semiconductor,"SID Digest '12: SID International Symposium Digest of Technical Papers, Jun. 5, 2012, vol. 43, No. 1, pp 183-186.
Kato, K. et al., "Evaluation of Off-State Current Characteristics of Transistor Using Oxide Semiconductor Material, Indium—Gallium—Zinc Oxide, " Japanese Journal of Applied Physics, 2012, vol. 51, pp. 021201-1-021201-7.
Yamazaki, S. et al., "Properties of crystalline In—Ga—Zn—oxide semiconductor and its transistor characteristics," Japanese Journal of Applied Physics, Mar. 31, 2014, vol. 53, No. 4S, pp. 04ED18-1-04ED18-10.
Yamazaki, S. et al., "In—Ga—Zn—Oxide Semiconductor and Its Transistor Characteristics," ECS Journal of Solid State Science and Technology, Jul. 1, 2014, vol. 3, No. 9, pp. Q3012- Q3022.
Yamazaki, S., "Crystalline Oxide Semiconductor Using CAAC-IGZO and its Application," ECS Transactions, Oct. 1, 2014, vol. 64, No. 10, pp. 155-164, The Electrochemical Society.
Fukunaga, Y. et al., "Low Power, High Image Quality Color Reflective LCDs Realized by Memory-in-Pixel Technology and Optical Optimization Using Newly-Developed Scattering Layer," SID Digest '13: SID International Symposium Digest of Technical Papers, 2011, pp. 701-704.
Matsuda, S. et al., "30-nm-Channel-Length C-Axis Aligned Crystalline In—Ga—Zn—O Transistors with Low Off-State Leakage Current and Steep Subthreshold Characteristics," 2015 Symposium on VLSI Technology : Digest of Technical Papers, 2015, pp. T216-T217.
Ito, S. et al., "Analysis of Nanoscale Crystalline Structure of In—Ga—Zn—O Thin Film with Nano Beam Electron Diffraction," AM-FPD '13 Digest of Technical Papers, Jul. 2, 2013, pp. 151-154.
International Search Report (Application No. PCT/IB2018/055582) dated Nov. 20, 2018.
Written Opinion (Application No. PCT/IB2018/055582) dated Nov. 20, 2018.
International Search Report (Application No. PCT/IB2018/056715) dated Dec. 18, 2018.
Written Opinion (Application No. PCT/IB2018/056715) dated Dec. 18, 2018.

* cited by examiner $a = x_1 w_1 + x_2 w_2 + b$

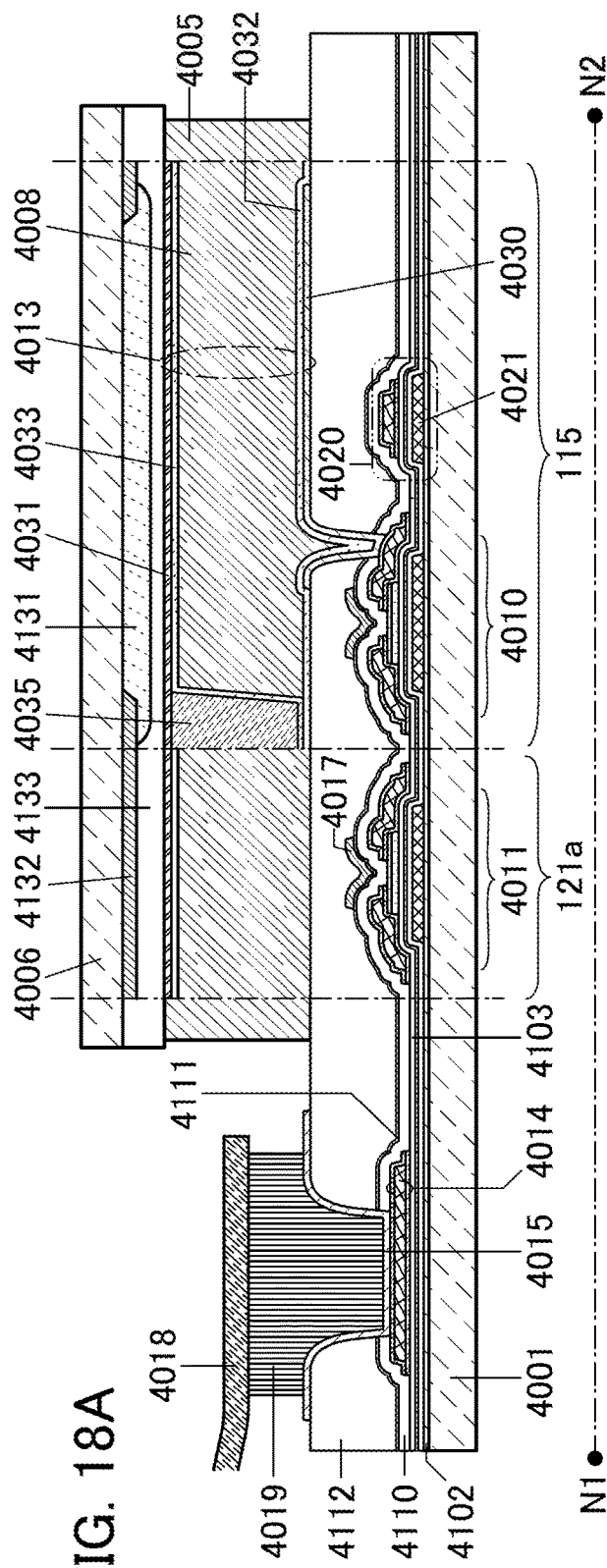
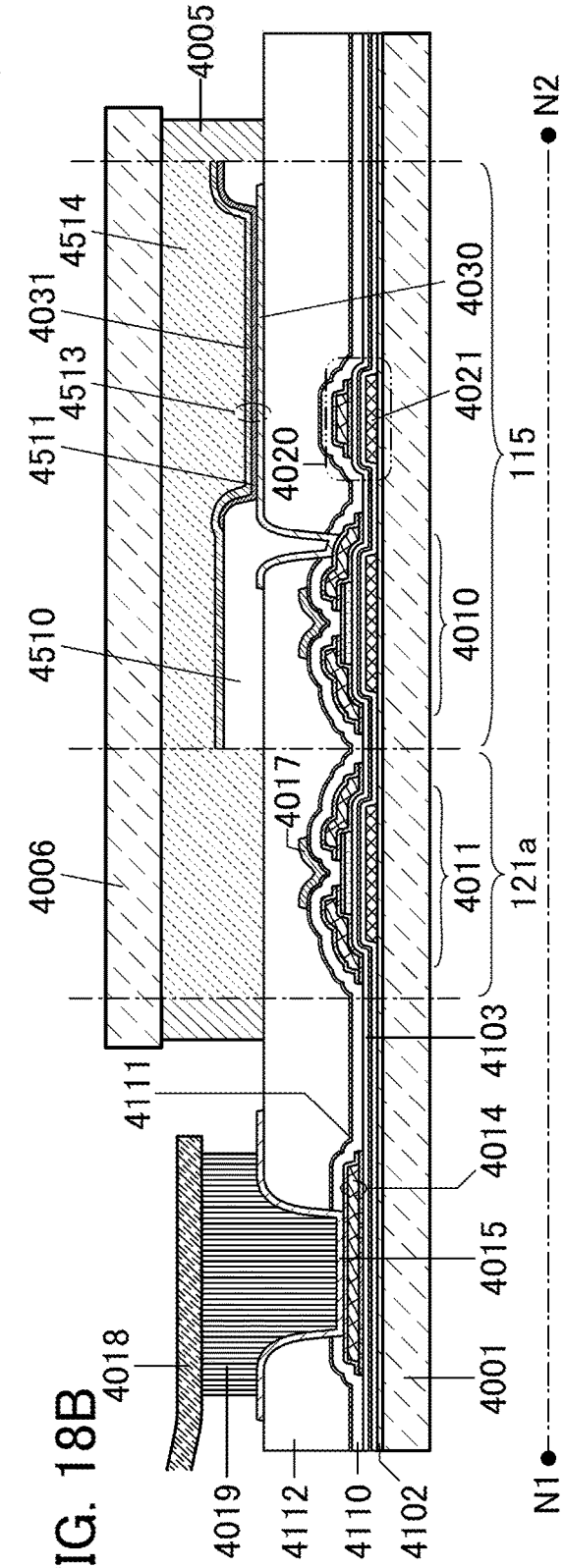
FIG. 18A
FIG. 18B

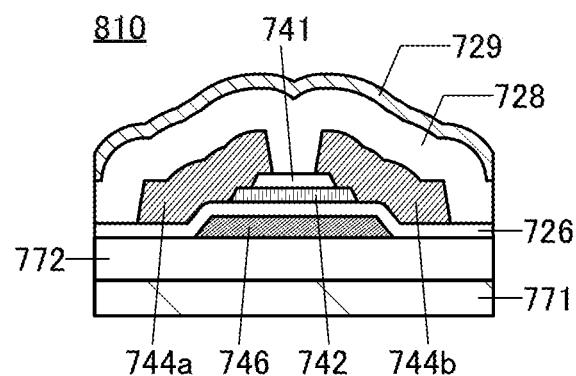
FIG. 20A1
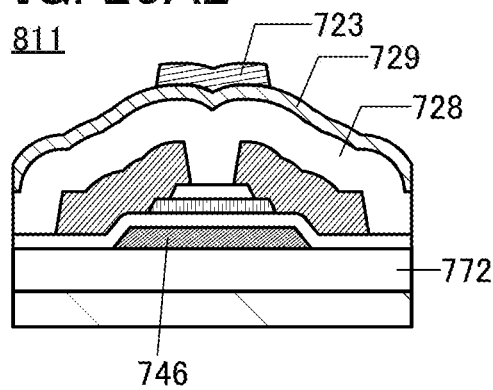
FIG. 20A2
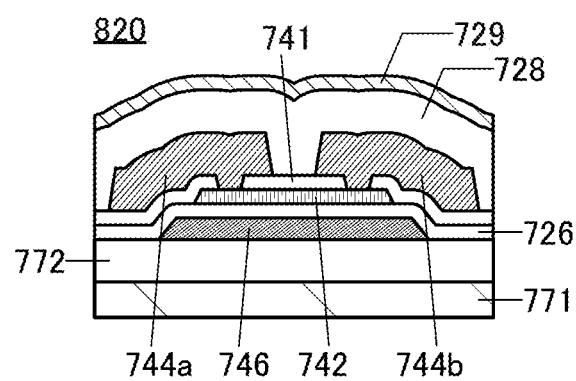
FIG. 20B1
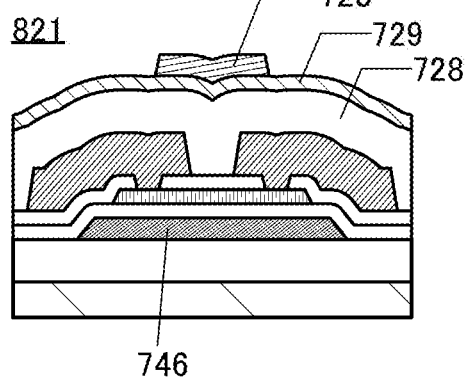
FIG. 20B2
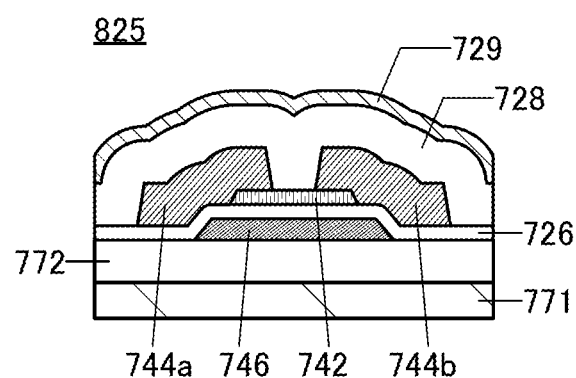
FIG. 20C1
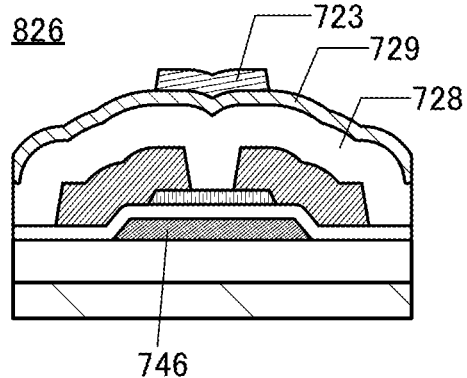
FIG. 20C2

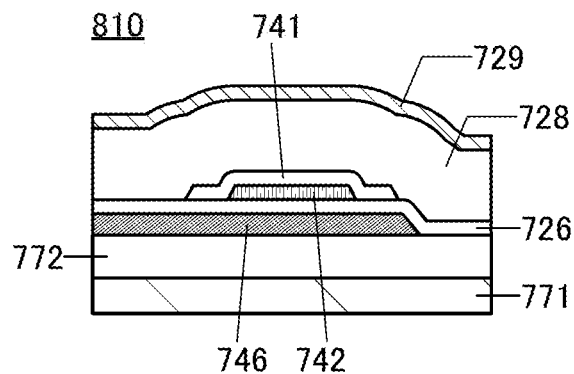
FIG. 21A1
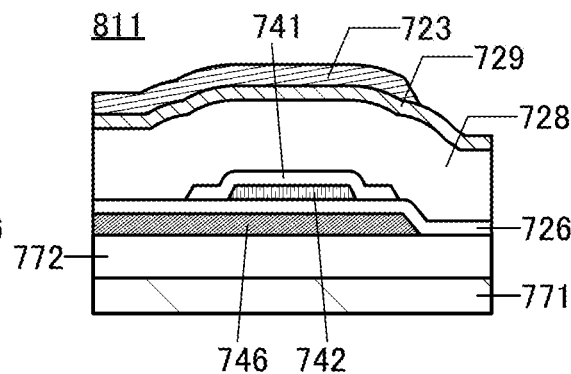
FIG. 21A2
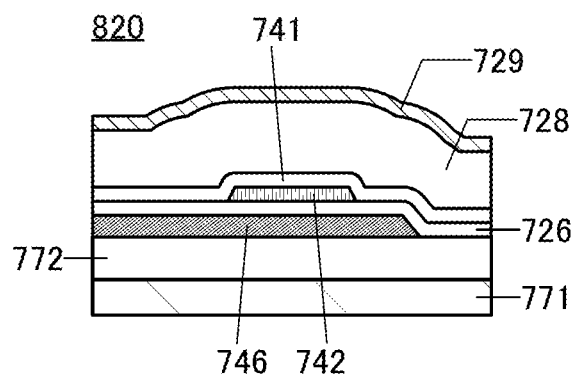
FIG. 21B1
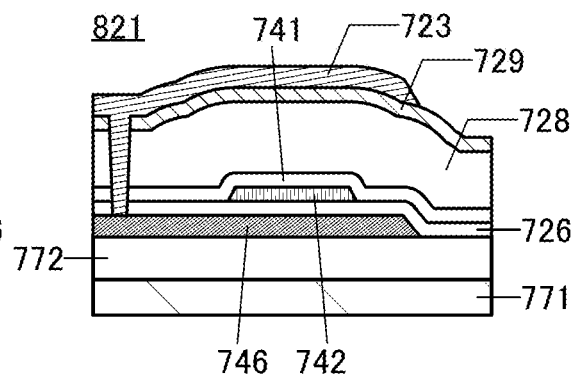
FIG. 21B2
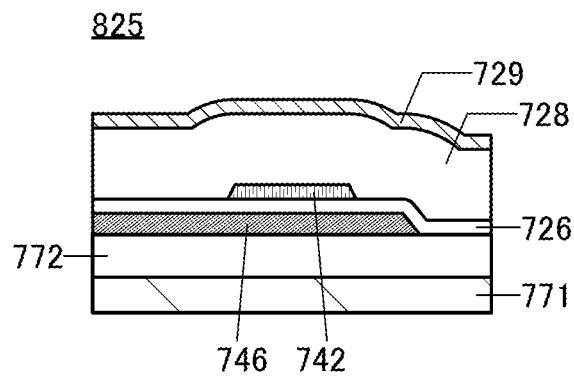
FIG. 21C1
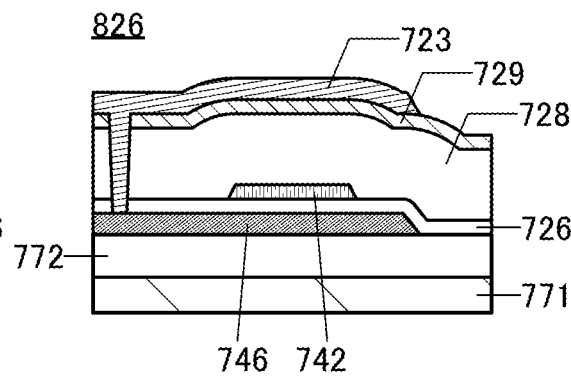
FIG. 21C2

FIG. 22A1
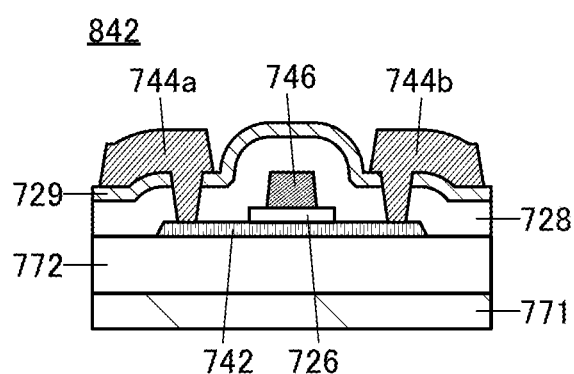
FIG. 22A2
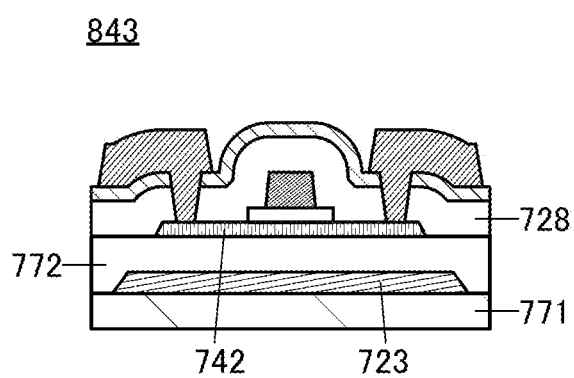
FIG. 22B1
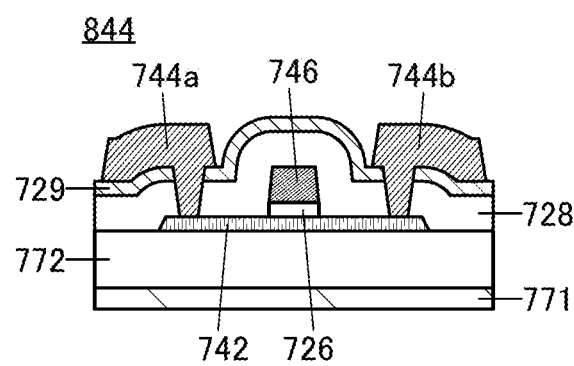
FIG. 22B2
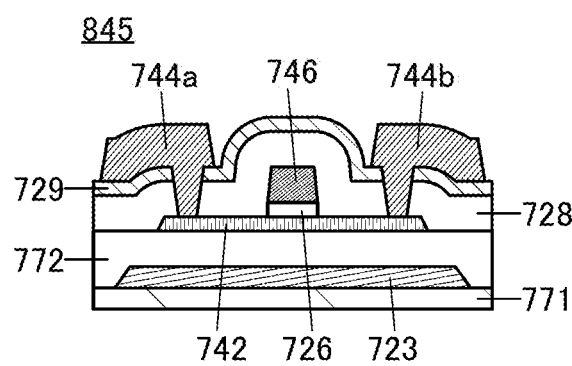
FIG. 22C1
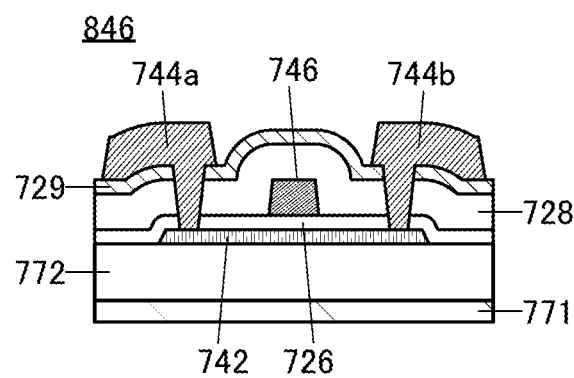
FIG. 22C2
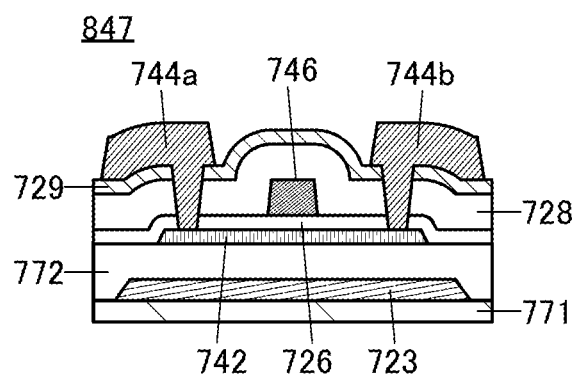

FIG. 23A1
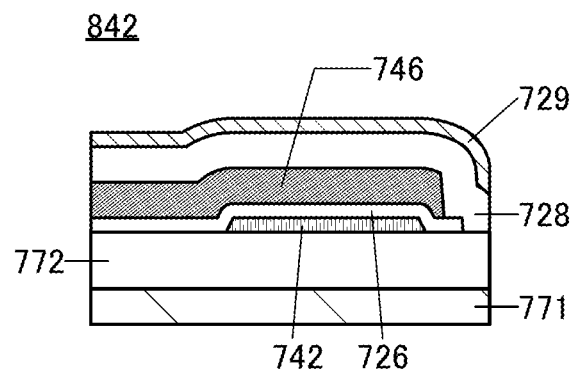
FIG. 23A2
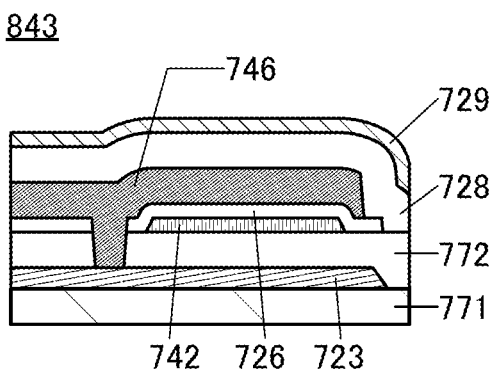
FIG. 23B1
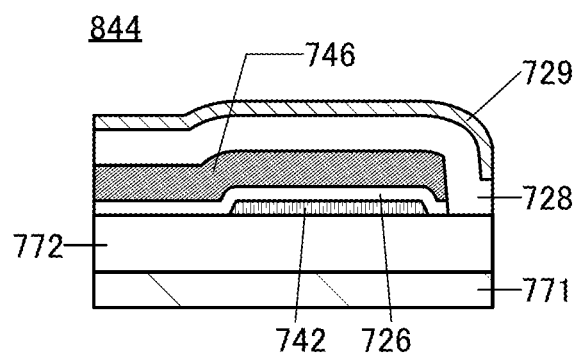
FIG. 23B2
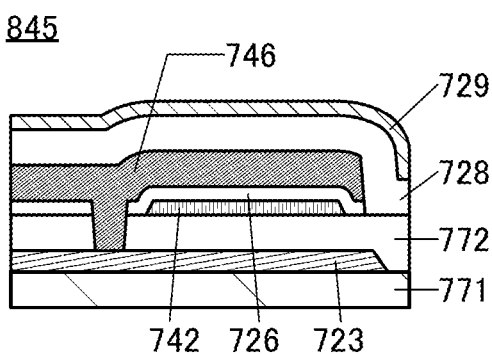
FIG. 23C1
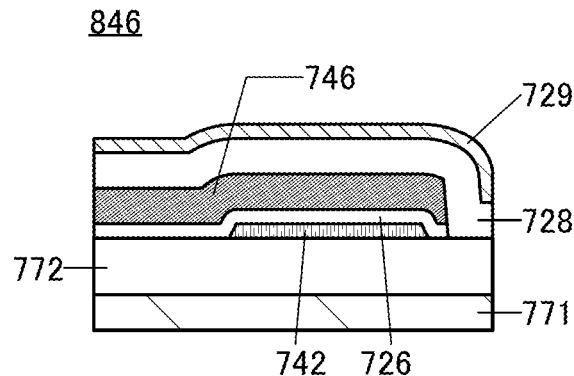
FIG. 23C2
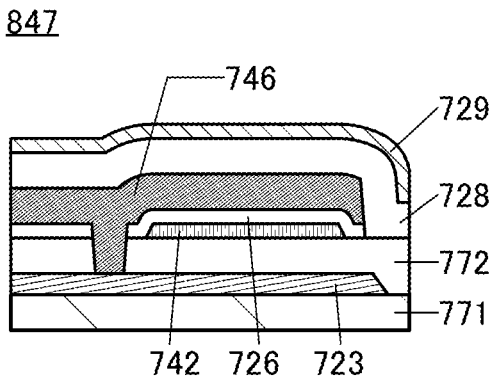

DISPLAY DEVICE AND ELECTRONIC DEVICE

This application is a 371 of international application PCT/IB2018/060298 filed on Dec. 19, 2018 which is incorporated herein by reference.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

Silicon-based semiconductor materials are widely known as semiconductor thin films which can be used in transistors; oxide semiconductors have been attracting attention as other materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having the CAAC structure is disclosed. Moreover, Non-Patent Document 4 and Non-Patent Document 5 disclose that a fine crystal is included even in an oxide semiconductor which has lower crystallinity than the CAAC structure and the nc structure.

In addition, a transistor which uses IGZO for an active layer has an extremely low off-state current (see Non-Patent Document 6), and an LSI and a display utilizing the characteristics have been reported (see Non-Patent Document 7 and Non-Patent Document 8).

Patent Document 1 discloses a memory device using a transistor with an extremely low off-state current in a memory cell.

REFERENCES

Patent Document

[Patent Document 1] Japanese Published Patent Application No. 2011-119674

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

The resolution of display devices has been increased; hardware capable of displaying images with an 8K4K resolution (pixel number: 7680×4320) or a higher resolution has been developed. In addition, the HDR (high dynamic range) display technique, which increases image quality by luminance adjustment, has been introduced.

For the proper display by a display device, image data needs to correspond to the resolution of the display device. In the case where a display device has an 8K4K resolution and image data corresponds to a 4K2K resolution (pixel number: 3840×2160), for example, the number of data must be converted by a fourfold increase to provide full-screen display. By contrast, in the case where a display device has a 4K2K resolution and image data corresponds to an 8K4K resolution, the number of data must be converted into a quarter.

In HDR processing, a dedicated circuit is necessary for generation of image data or conversion of the number of data, which causes a problem of an increase in power consumption. It is preferable that at least original image data be input to pixels in a display device without conversion.

Thus, an object of one embodiment of the present invention is to provide a display device capable of improving image quality. Another object is to provide a display device capable of performing the proper display without conversion of image data. Another object is to provide a display device capable of performing HDR display. Another object is to provide a display device capable of performing upconversion operation. Another object is to provide a display device capable of enhancing the luminance of a displayed image.

Another object is to provide a display device capable of displaying two images superimposed on each other.

Another object is to provide a display device with low power consumption. Another object is to provide a highly reliable display device. Another object is to provide a novel display device or the like. Another object is to provide a method for driving any of the display devices. Another object is to provide a novel semiconductor device or the like.

Note that the description of these objects does not preclude the existence of other objects. One embodiment of the present invention does not have to achieve all the objects. Other objects will be apparent from the description of the specification, the drawings, the claims, and the like, and other objects can be derived from the description of the specification, the drawings, the claims, and the like.

Means for Solving the Problems

Another embodiment of the present invention is a display device including a first pixel circuit, a second pixel circuit, a first wiring, a second wiring, a third wiring, a fourth wiring, a fifth wiring, and a sixth wiring; the first pixel circuit includes a first transistor, a second transistor, a first capacitor, and a first circuit block; the second pixel circuit includes a third transistor, a fourth transistor, a second capacitor, and a second circuit block; one of a source and a drain of the first transistor is electrically connected to one electrode of the first capacitor; the other electrode of the first capacitor is electrically connected to one of a source and a drain of the second transistor; the one of the source and the drain of the second transistor is electrically connected to the first circuit block; one of a source and a drain of the third transistor is electrically connected to one electrode of the second capacitor; the other electrode of the second capacitor is electrically connected to one of a source and a drain of the fourth transistor; the one of the source and the drain of the fourth transistor is electrically connected to the second circuit block; a gate of the second transistor and a gate of the fourth transistor are electrically connected to the first wiring; a gate of the first transistor is electrically connected to the second wiring; a gate of the third transistor is electrically connected to the third wiring; the other of the source and the drain of the second transistor is electrically connected to the fourth wiring; the other of the source and the drain of the first transistor and the other of the source and the drain of the third transistor are electrically connected to the fifth wiring; the other of the source and the drain of the fourth transistor is electrically connected to the sixth wiring; the first circuit block includes a first display element; and the second circuit block includes a second display element.

Another embodiment of the present invention is a display device including a first pixel circuit, a second pixel circuit, a first wiring, a second wiring, a third wiring, a fourth wiring, a fifth wiring, and a sixth wiring; the first pixel circuit includes a first transistor, a second transistor, a first capacitor, and a first circuit block; the second pixel circuit includes a third transistor, a fourth transistor, a second capacitor, and a second circuit block; one of a source and a drain of the first transistor is electrically connected to one electrode of the first capacitor; the other electrode of the first capacitor is electrically connected to one of a source and a drain of the second transistor; the one of the source and the drain of the second transistor is electrically connected to the first circuit block; one of a source and a drain of the third transistor is electrically connected to one electrode of the second capacitor; the other electrode of the second capacitor is electrically connected to one of a source and a drain of the fourth transistor; the one of the source and the drain of the fourth transistor is electrically connected to the second circuit block; a gate of the second transistor is electrically connected to the first wiring; a gate of the fourth transistor is electrically connected to the second wiring; a gate of the first transistor and a gate of the third transistor are electrically connected to the third wiring; the other of the source and the drain of the first transistor is electrically connected to the fourth wiring; the other of the source and the drain of the second transistor and the other of the source and the drain of the fourth transistor are electrically connected to the fifth wiring; the other of the source and the drain of the third transistor is electrically connected to the sixth wiring; the first circuit block includes a first display element; and the second circuit block includes a second display element.

The above display device can have the following structure: the first circuit block includes a fifth transistor, a sixth transistor, a third capacitor, and a first organic EL element as the first display element; the second circuit block includes a seventh transistor, an eighth transistor, a fourth capacitor, and a second organic EL element as the second display element; one electrode of the first organic EL element is electrically connected to one of a source and a drain of the sixth transistor; the other of the source and the drain of the sixth transistor is electrically connected to one electrode of the third capacitor; the one electrode of the third capacitor is electrically connected to one of a source and a drain of the fifth transistor; a gate of the fifth transistor is electrically connected to the other electrode of the third capacitor; the other electrode of the third capacitor is electrically connected to the other electrode of the first capacitor; one electrode of the second organic EL element is electrically connected to one of a source and a drain of the eighth transistor; the other of the source and the drain of the eighth transistor is electrically connected to one electrode of the fourth capacitor; the one electrode of the fourth capacitor is electrically connected to one of a source and a drain of the seventh transistor; a gate of the seventh transistor is electrically connected to the other electrode of the fourth capacitor; and the other electrode of the fourth capacitor is electrically connected to the other electrode of the second capacitor.

The above display device can have the following structure: the first circuit block includes a ninth transistor, a fifth capacitor, and a first liquid crystal element as the first display element; the second circuit block includes a tenth transistor, a sixth capacitor, and a second liquid crystal element as the second display element; one electrode of the first liquid crystal element is electrically connected to one electrode of the fifth capacitor; the one electrode of the fifth capacitor is electrically connected to one of a source and a drain of the ninth transistor; the other of the source and the drain of the ninth transistor is electrically connected to the other electrode of the first capacitor; one electrode of the second liquid crystal element is electrically connected to one electrode of the sixth capacitor; the one electrode of the sixth capacitor is electrically connected to one of a source and a drain of the tenth transistor; and the other of the source and the drain of the tenth transistor is electrically connected to the other electrode of the second capacitor.

In the above display device, it is preferable that the second transistor include a metal oxide in a channel formation region and the metal oxide include In, Zn, and M (M is Al, Ti, Ga, Sn, Y, Zr, La, Ce, Nd, or Hf).

Another embodiment of the present invention is an electronic device including the above display device and a camera.

Effect of the Invention

With the use of one embodiment of the present invention, a display device capable of improving image quality can be provided. Alternatively, a display device capable of performing the proper display without conversion of image data can be provided. Alternatively, a display device capable of performing HDR display can be provided. Alternatively, a display device capable of performing an upconversion operation can be provided. Alternatively, a display device capable of enhancing the luminance of a displayed image can be provided. Alternatively, a display device capable of displaying two images superimposed on each other can be provided.

Alternatively, a display device with low power consumption can be provided. Alternatively, a highly reliable display device can be provided. Alternatively, a novel display device or the like can be provided. Alternatively, a method for driving any of the display devices can be provided. Alternatively, a novel semiconductor device or the like can be provided.

BRIEF DESCRIPTION OF THE DRAWINGS

FIGS. 18A and 18B are diagrams each illustrating a display device.

FIGS. 20A1-20C2 are diagrams each illustrating a transistor.

FIGS. 21A1-21C2 are diagrams each illustrating a transistor.

FIGS. 22A1-22C2 are diagrams each illustrating a transistor.

FIGS. 23A1-23C2 are diagrams each illustrating a transistor.

MODE FOR CARRYING OUT THE INVENTION

Figure 1:
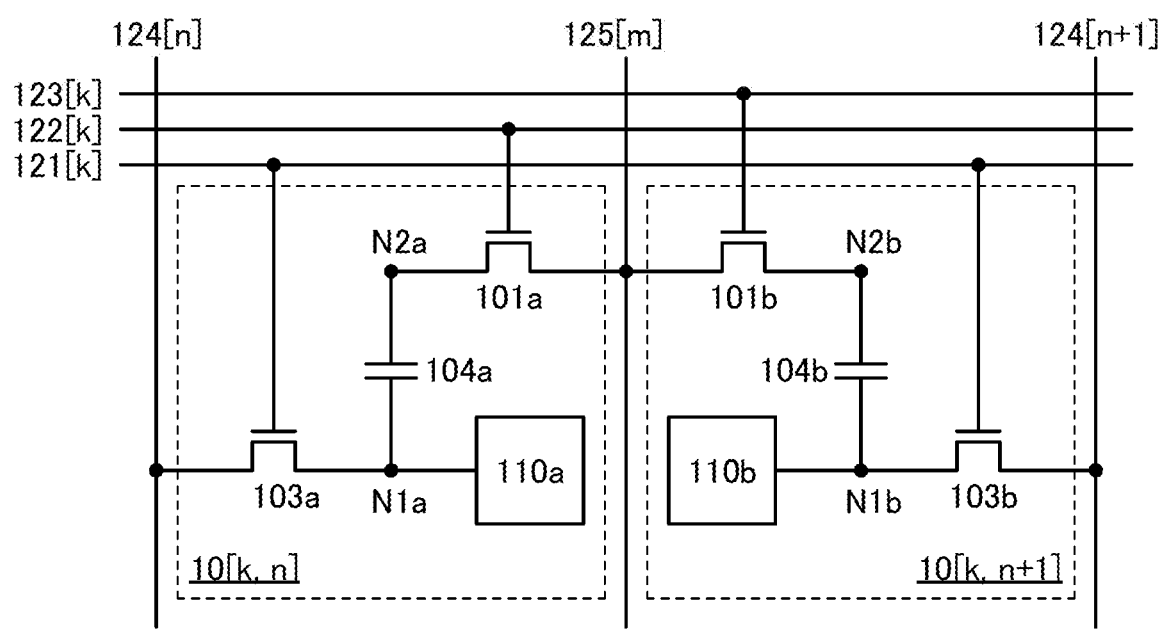
FIG. 1 is a diagram illustrating a pixel circuit.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. However, the same components might be denoted by different hatching patterns in different drawings, or the hatching patterns might be omitted.

Embodiment 1

In this embodiment, a display device of one embodiment of the present invention is described with reference to drawings.

One embodiment of the present invention is a display device having a function of correcting image data in pixels. A storage node is provided in each pixel and first data can be held in the storage node. Second data is added to the first data by capacitive coupling, and then can be supplied to a display element. Alternatively, the first data can be added by capacitive coupling after the second data is written to the storage node.

Thus, the display device can display a corrected image. Through the correction, image upconversion can be performed. Alternatively, HDR display can be performed by correction of part or the whole of an image in a display portion. Alternatively, the luminance of a displayed image can be significantly improved when the same image data is used as the first data and the second data. Alternatively, given images superimposed on each other can be displayed when different image data are used as the first data and the second data.

Furthermore, with the use of one embodiment of the present invention, proper display can be performed without upconversion or downconversion of both image data for high resolution and image data for low resolution. In the case of high-resolution display, individual data is supplied to each pixel through a first transistor included in the pixel. In the case of low-resolution display, the same data is supplied to a plurality of pixels through a second transistor electrically connected to the plurality of pixels.

The image data for high resolution here corresponds to, for example, data having the amount of information corresponding to 8K4K (pixel number: 7680×4320). The image data for low resolution corresponds to, for example, data having the amount of information corresponding to 4K2K (pixel number: 3840×2160). That is, it is assumed that the ratio of the number of effective image data (corresponding to the number of effective pixels) for high resolution to that for low resolution is 4:1.

Note that as long as the ratio between the numbers of data (pixels) is 4:1, the image data for high resolution may be data corresponding to 4K2K and the image data for low resolution may be data corresponding to Full HD (pixel number: 1920×1080) without limitation to the above example. Alternatively, the image data for high resolution may be data corresponding to 16K8K (pixel number: 15360×8640) and the image data for low resolution may be data corresponding to 8K4K.

<Structure Example 1 of Pixel>

FIG. 1 is a diagram illustrating a pixel circuit 10 that can be used for the display device of one embodiment of the present invention.

A pixel circuit 10[k, n] includes a transistor 101a, a transistor 103a, a capacitor 104a, and a circuit block 110a. A pixel circuit 10[k, n+1] is adjacent to the pixel circuit 10[k, n] and includes a transistor 101b, a transistor 103b, a capacitor 104b, and a circuit block 110b.

The circuit block 110a and the circuit block 110b can each include a transistor, a capacitor, a display element, and the like. A variety of elements can be used as the display element; typically, a light-emitting element, a liquid crystal element, or the like can be used. As an example of the light-emitting element, an LED (Light Emitting Diode), an OLED (Organic LED), a QLED (Quantum-dot LED), or a semiconductor laser can be given. A small LED (also referred to as a micro LED), for example, an LED with a die area of 10000 µm$^2$ or less can be favorably used. As the liquid crystal element, a transmissive liquid crystal element, a reflective liquid crystal element, a transflective liquid crystal element, or the like can be used. Moreover, as the display element, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can also be used, for example.

In the pixel circuit 10[k, n], one of a source and a drain of the transistor 101a is electrically connected to one electrode of the capacitor 104a. The other electrode of the capacitor 104a is electrically connected to one of a source and a drain of the transistor 103a. The one of the source and the drain of the transistor 103a is electrically connected to the circuit block 110a.

In the pixel circuit 10[k, n+1], one of a source and a drain of the transistor 101b is electrically connected to one electrode of the capacitor 104b. The other electrode of the capacitor 104b is electrically connected to one of a source and a drain of the transistor 103b. The one of the source and the drain of the transistor 103b is electrically connected to the circuit block 110b.

Here, a node to which the transistor 103a, the capacitor 104a, and the circuit block 110a are connected is referred to as a node N1a. A node to which the transistor 103b, the capacitor 104b, and the circuit block 110b are connected is referred to as a node N1b. Note that components of the circuit block 110a and the circuit block 110b can make the node N1a and the node N1b floating.

A node to which the transistor 101a and the capacitor 104a are connected is denoted by N2a. A node to which the transistor 101b and the capacitor 104b are connected is denoted by N2b.

A gate of the transistor 101a is electrically connected to a wiring 122[k]. A gate of the transistor 101b is electrically connected to a wiring 123[k]. A gate of the transistor 103a and a gate of the transistor 103b are electrically connected to a wiring 121[k]. The other of the source and the drain of the transistor 101a and the other of the source and the drain of the transistor 101b are electrically connected to a wiring 125[m]. In other words, the transistor 101a and the transistor 101b share the wiring 125[m]. The other of the source and the drain of the transistor 103a is electrically connected to a wiring 124[n]. The other of the source and the drain of the transistor 103b is electrically connected to a wiring 124[n+1].

The wiring 121[k], the wiring 122[k], and the wiring 123[k] can function as signal lines for controlling the operation of the transistors. The wiring 124[n], the wiring 124[n+1], and the wiring 125[m] can function as signal lines for supplying the first data and the second data.

In one embodiment of the present invention, one signal line (the wiring 125[m]) can supply the first data and the second data to two pixels adjacent to each other in the row direction. That is, the pixel can be configured with a small number of wirings.

Note that in this specification and the like, the extending direction of the wiring 121 is referred to as the row direction or the horizontal direction, and the extending direction of the wiring 125 is referred to as the column direction or the perpendicular direction.

The node N1a is a storage node; when the transistor 103a is turned on, data supplied to the wiring 124[n] can be written to the node N1a. When the transistor 103a is turned off, the data can be held in the node N1a. The node N1b is a storage node; when the transistor 103b is turned on, data supplied to the wiring 124[n+1] can be written to the node N1b. When the transistor 103b is turned off, the data can be held in the node N1b.

A transistor with an extremely low off-state current is used as the transistor 103a and the transistor 103b, whereby potentials of the node N1a and the node N1b can be held for a long time. As the transistor, a transistor using a metal oxide in a channel formation region (hereinafter, an OS transistor) can be favorably used, for example.

Note that an OS transistor may be used not only as the transistor 103a and the transistor 103b but also as other transistors included in the pixels. A transistor including Si in a channel formation region (hereinafter, a Si transistor) may be used as the transistor 103a and the transistor 103b. Alternatively, both an OS transistor and a Si transistor may be used. Examples of the Si transistor include a transistor including amorphous silicon and a transistor including crystalline silicon (typically, low-temperature polysilicon or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS exhibits excellent mobility characteristics and thus is suitable for a transistor that operates at high speed, for example.

A semiconductor layer included in an OS transistor has a large energy gap, and thus the OS transistor exhibits an extremely low off-state current characteristic. An OS transistor has features such that impact ionization, an avalanche breakdown, a short-channel effect, or the like is less likely to occur, which are different from those of a Si transistor. Thus, a highly reliable circuit can be formed.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor included in the semiconductor layer is an In-M-Zn-based oxide, it is preferable that the atomic ratio of metal elements of a sputtering target used for depositing the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratio of metal elements contained in the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. The oxide semiconductor can be said to have a low density of defect states and stable characteristics.

Note that, without limitation to those described above, a semiconductor layer with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio of a metal element to oxygen, the interatomic distance, the density, and the like of the semiconductor layer be set to appropriate values.

When the oxide semiconductor included in the semiconductor layer contains silicon or carbon, which is an element belonging to Group 14, oxygen vacancies are increased and the semiconductor layer becomes n-type. Thus, the concentration of silicon or carbon (concentration measured by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal (concentration measured by secondary ion mass spectrometry) in the semiconductor layer is set to lower than or equal to $1 \times 10^{18}$ atoms/cm$^3$, preferably lower than or equal to $2 \times 10^{16}$ atoms/cm$^3$.

When nitrogen is contained in the oxide semiconductor included in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the concentration of nitrogen (concentration measured by secondary ion mass spectrometry) in the semiconductor layer is preferably set to lower than or equal to $5 \times 10^{18}$ atoms/cm$^3$.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

Described below is the composition of a CAC (Cloud-Aligned Composite)-OS, which is one embodiment of a non-single-crystal semiconductor layer.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that IGZO is a common name, which may specify a compound containing In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the metal element(s) as a main component(s) are observed in part of a CAC-OS and nanoparticle regions containing In as a main component are observed in part thereof, and these nanoparticle regions are randomly dispersed to form a mosaic pattern.

The CAC-OS can be formed by a sputtering method under a condition where a substrate is not heated, for example. In the case where the CAC-OS is formed by a sputtering method, one or more of an inert gas (typically, argon), an oxygen gas, and a nitrogen gas may be used as a deposition gas. The ratio of the flow rate of an oxygen gas to the total flow rate of the deposition gas in deposition is preferably as low as possible; for example, the ratio of the flow rate of the oxygen gas is preferably higher than or equal to 0% and lower than 30%, further preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from the X-ray diffraction measurement that no alignment in the a-b plane direction and the c-axis direction is observed in a measured areas.

In an electron diffraction pattern of the CAC-OS which is obtained by irradiation with an electron beam with a probe diameter of 1 nm (also referred to as a nanobeam electron beam), a ring-like region with high luminance and a plurality of bright spots in the ring region are observed. Thus, it is found from the electron diffraction pattern that the crystal structure of the CAC-OS includes an nc (nano-crystal) structure with no alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are phase-separated from each other and form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is exhibited. Accordingly, when regions containing $In_{X1}Zn_{Y2}O_{Z2}$ or $InO_{X1}$ as a main component are distributed in an oxide semiconductor like a cloud, high field-effect mobility (μ) can be achieved.

By contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used as a material in a variety of semiconductor devices.

An example of an operation in which correction data is added to image data in the pixel circuit 10[$k$, $n$] and the pixel circuit 10[$k$, $n$+1] is described with reference to a timing chart shown in FIG. 2(A). Note that in the following description, "H" represents a high potential, "L" represents a low potential, and "Vcom" represents a common potential. Furthermore, "Vpa" and "Vpb" each represent correction data, and "Vs" represents image data. Note that "Vpa" and "Vpb" can also represent given first data, and "Vs" can represent given second data. Note that in potential distribution, potential coupling, or potential loss, detailed changes due to a circuit configuration, operation timing, or the like are not considered. A change in potential resulting from capacitive coupling depends on the capacitance ratio of a side that supplies a potential to a side that is supplied with the potential; however, for simple description, the capacitance values of the nodes are assumed to be sufficiently small.

At Time T1, the potential of the wiring 121[$k$] is "H", the potential of the wiring 122[$k$] is "H", and the potential of the wiring 123[$k$] is "H", so that the transistor 101$a$, the transistor 103$a$, the transistor 101$b$, and the transistor 103$b$ are turned on.

During Period T1-T2, when the potential of the wiring 124[$n$] is "Vpa" and the potential of the wiring 124[$n$+1] is "Vpb", the potential of the wiring 124[$n$] (the correction data "Vpa") is written to the node N1$a$, and the potential of the wiring 124[$n$+1] (the correction data "Vpb") is written to the node N1$b$. When the potential of the wiring 125[$m$] is "Vcom", the potential of the wiring 125[$m$] ("Vcom") is written to each of the node N2$a$ and the node N2$b$.

At Time T2, the potential of the wiring 121[$k$] is "L", the potential of the wiring 122[$k$] is "H", and the potential of the wiring 123[$k$] is "H", so that the transistor 103$a$ and the transistor 103$b$ are turned off, the correction data "Vpa" is held in the node N1$a$, and the correction data "Vpb" is held in the node N1b. In addition, "Vpa−Vcom" is held in the capacitor 104a and "Vpb−Vcom" is held in the capacitor 104b.

Note that in the case where the correction is not performed, the same potential as "Vcom" is supplied as the correction data "Vpa" and "Vpb" in the above operation.

During Period T2-T3, when the potential of the wiring 125[m] is "Vs", the potential of the wiring 125[m] (the image data "Vs") is written to the node N2a. The potential of the wiring 125[m], "Vs", is added to the potential of the node N1a by capacitive coupling of the capacitor 104a. At this time, the potential of the node N1a is "Vpa−Vcom+Vs". In the case where the parasitic capacitance other than that of the transistor 101a is not considered, the potential of the node N1a becomes "Vpa+Vs" when "Vcom"=0.

At Time T3, the potential of the wiring 121[k] is "L", the potential of the wiring 122[k] is "L", and the potential of the wiring 123[k] is "H", so that the transistor 101a is turned off and the potential of the node N1a is held at "Vpa+Vs".

During Period T3-T4, when the potential of the wiring 125[m] is "Vs", the potential of the wiring 125[m] (the image data "Vs") is written to the node N2b. The potential of the wiring 125[m], "Vs", is added to the potential of the node N1b by capacitive coupling of the capacitor 104b. At this time, the potential of the node N1b is "Vpb−Vcom+Vs". In the case where the parasitic capacitance other than that of the transistor 101a is not considered, the potential of the node N1b becomes "Vpb+Vs" when "Vcom"=0.

At Time T4, the potential of the wiring 121[k] is "L", the potential of the wiring 122[k] is "L", and the potential of the wiring 123[k] is "L", so that the transistor 101b is turned off and the potential of the node N1b is held at "Vpb+Vs".

After that, the display elements included in the circuit block 110a and the circuit block 110b perform display operations in accordance with the potentials of the node N1a and the node N1b.

Figure 2A:
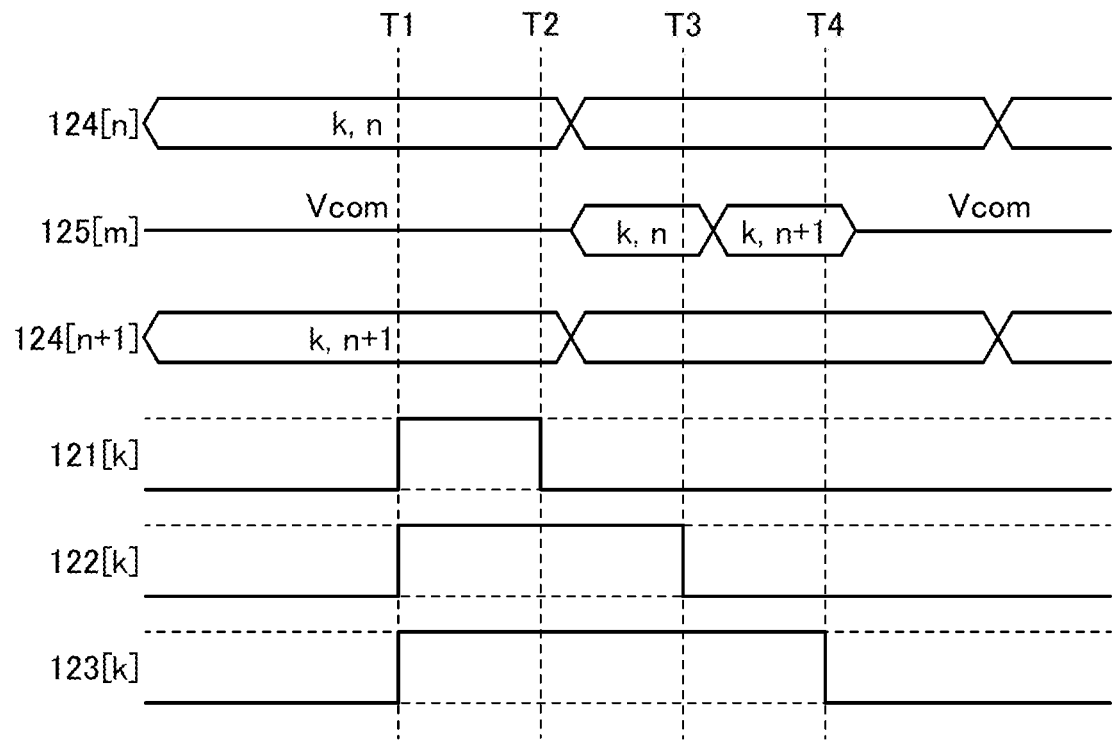
FIGS. 2A and 2B are timing charts each showing an operation of a pixel circuit.
Figure 2B:
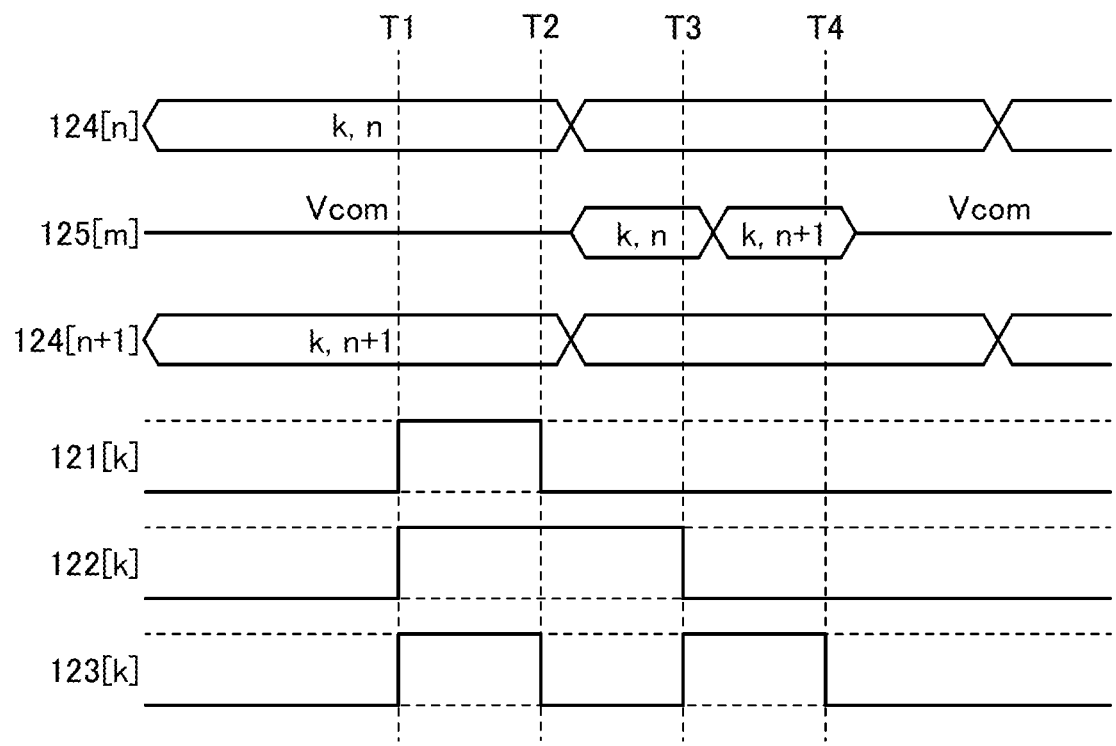

FIG. 2(B) shows an example different from the timing chart shown in FIG. 2(A). FIG. 2(B) is different from the timing chart shown in FIG. 2(A) in that the potential of the wiring 122[k] is "L" during Period T2-T3. By following the timing chart shown in FIG. 2(B), unnecessary driving in the pixel circuit 10[k, n+1] can be reduced.

Note that the operations in FIG. 2(A) and FIG. 2(B) can each be sequentially performed in one horizontal period.

<Structure Example 2 of Pixel>

Figure 3:
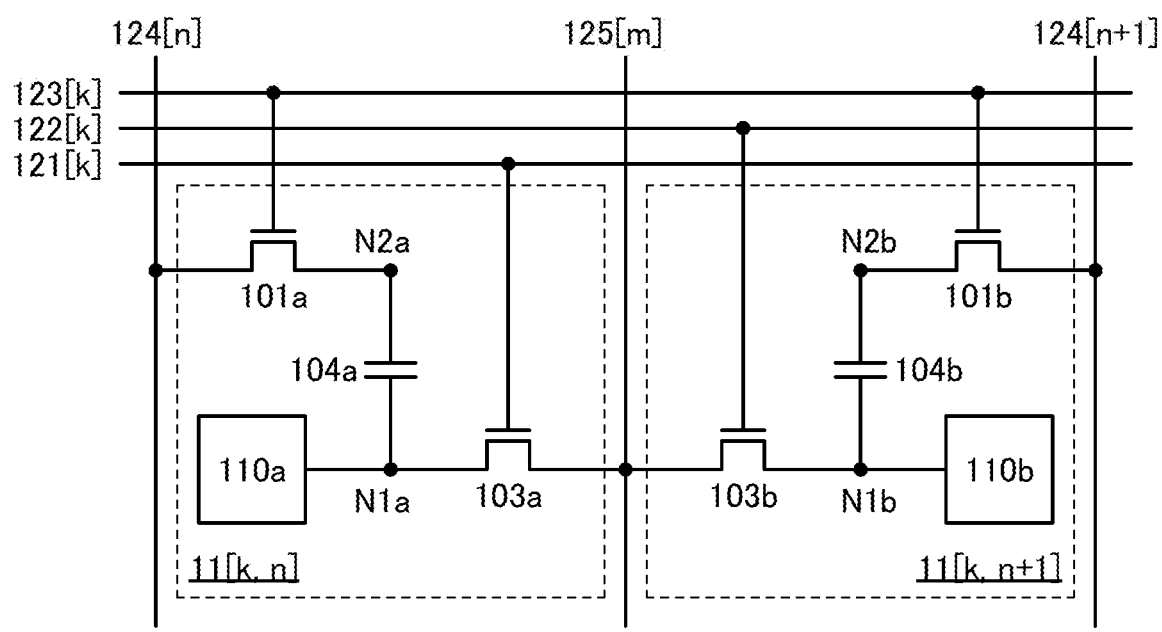
FIG. 3 is a diagram illustrating a pixel circuit.

FIG. 3 is a diagram illustrating a pixel circuit 11 that can be used for the display device of one embodiment of the present invention.

The pixel circuit 11 illustrated in FIG. 3 is different from the pixel circuit 10 illustrated in FIG. 1 in the connection structure of the transistors and the wirings. A pixel circuit 11[k, n+1] is adjacent to a pixel circuit 11[k, n]. The description of the pixel circuit 10[k, n] can be referred to for the structure of the pixel circuit 11[k, n], and the detailed description is omitted. The description of the pixel circuit 10[k, n+1] can be referred to for the structure of the pixel circuit 11[k, n+1], and the detailed description is omitted.

The gate of the transistor 101a is electrically connected to the wiring 123[k]. The gate of the transistor 101b is electrically connected to the wiring 123[k]. The gate of the transistor 103a is electrically connected to the wiring 121[k]. The gate of the transistor 103b is electrically connected to the wiring 122[k]. The other of the source and the drain of the transistor 103a and the other of the source and the drain of the transistor 103b are electrically connected to the wiring 125[m]. In other words, the transistor 103a and the transistor 103b share the wiring 125[m]. The other of the source and the drain of the transistor 101a is electrically connected to the wiring 124[n]. The other of the source and the drain of the transistor 101b is electrically connected to the wiring 124[n+1].

An example of an operation in which correction data is added to image data in the pixel circuit 11[k, n] and the pixel circuit 11[k, n+1] is described with reference to a timing chart shown in FIG. 4(A).

At Time T1, the potential of the wiring 121[k] is "H", the potential of the wiring 122[k] is "H", and the potential of the wiring 123[k] is "H", so that the transistor 101a, the transistor 103a, the transistor 101b, and the transistor 103b are turned on.

During Period T1-T2, when the potential of the wiring 125[m] is "Vs", the potential of the wiring 125[m] (the image data "Vs") is written to the node N1a. When the potential of the wiring 124[n] is "Vcom" and the potential of the wiring 124[n+1] is "Vcom", the potential of the wiring 124[n] ("Vcom") is written to the node N2a.

At Time T2, the potential of the wiring 121[k] is "L", the potential of the wiring 122[k] is "H", and the potential of the wiring 123[k] is "H", so that the transistor 103a is turned off and the image data "Vs" is held in the node N1a. In addition, "Vs −Vcom" is held in the capacitor 104a.

During Period T2-T3, when the potential of the wiring 124[n] is "Vpa", the potential of the wiring 124[n] (the correction data "Vpa") is written to the node N2a. The potential of the wiring 124[n], "Vpa", is added to the potential of the node N1a by capacitive coupling of the capacitor 104a. At this time, the potential of the node N1a is "Vs−Vcom+Vpa". In the case where the parasitic capacitance other than that of the transistor 101a is not considered, the potential of the node N1a becomes "Vpa+Vs" when "Vcom"=0. When the potential of the wiring 125[m] is "Vs", the potential of the wiring 125[m] (the image data "Vs") is written to the node N1b. When the potential of the wiring 124[n+1] is "Vcom", the potential of the wiring 124[n+1] ("Vcom") is written to the node N2b.

At Time T3, the potential of the wiring 121[k] is "L", the potential of the wiring 122[k] is "H", and the potential of the wiring 123[k] is "H", so that the transistor 103b is turned off and the image data "Vs" is held in the node N1b. In addition, "Vs−Vcom" is held in the capacitor 104b.

During Period T3-T4, when the potential of the wiring 124[n+1] is "Vpb", the potential of the wiring 124[n+1] (the correction data "Vpb") is written to the node N2b. The potential of the wiring 124[n+1], "Vpb", is added to the potential of the node N1b by capacitive coupling of the capacitor 104b. At this time, the potential of the node N1b is "Vs−Vcom+Vpb". In the case where the parasitic capacitance other than that of the transistor 101a is not considered, the potential of the node N1b becomes "Vpb+Vs" when "Vcom"=0. Note that in the case where the correction is not performed, the same potential as "Vcom" is supplied as the correction data "Vpa" and "Vpb" in the above operation.

At Time T4, the potential of the wiring 121[k] is "L", the potential of the wiring 122[k] is "L", and the potential of the wiring 123[k] is "L", so that the transistor 101a and the transistor 101b are turned off, the potential of the node N1a is held at "Vpa+Vs", and the potential of the node N1b is held at "Vpb+Vs".

After that, the display elements included in the circuit block 110a and the circuit block 110b perform display operations in accordance with the potentials of the node N1a and the node N1b.

Figure 4A:
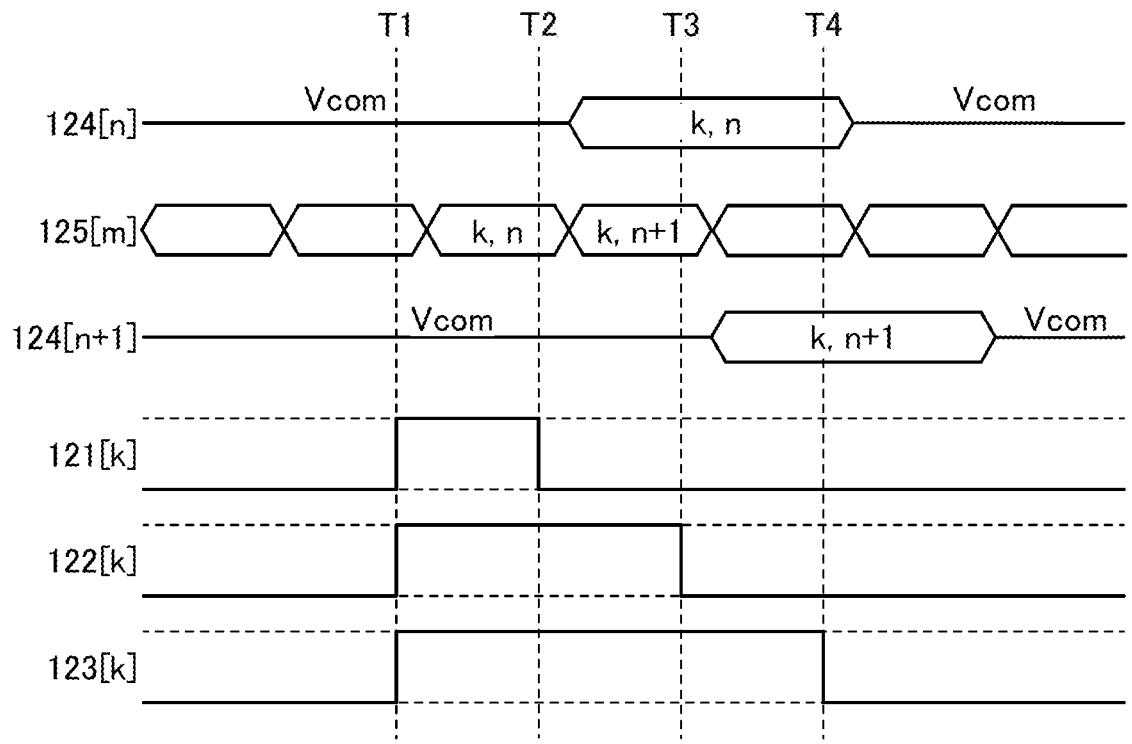
FIGS. 4A and 4B are timing charts each showing an operation of a pixel circuit.
Figure 4B:
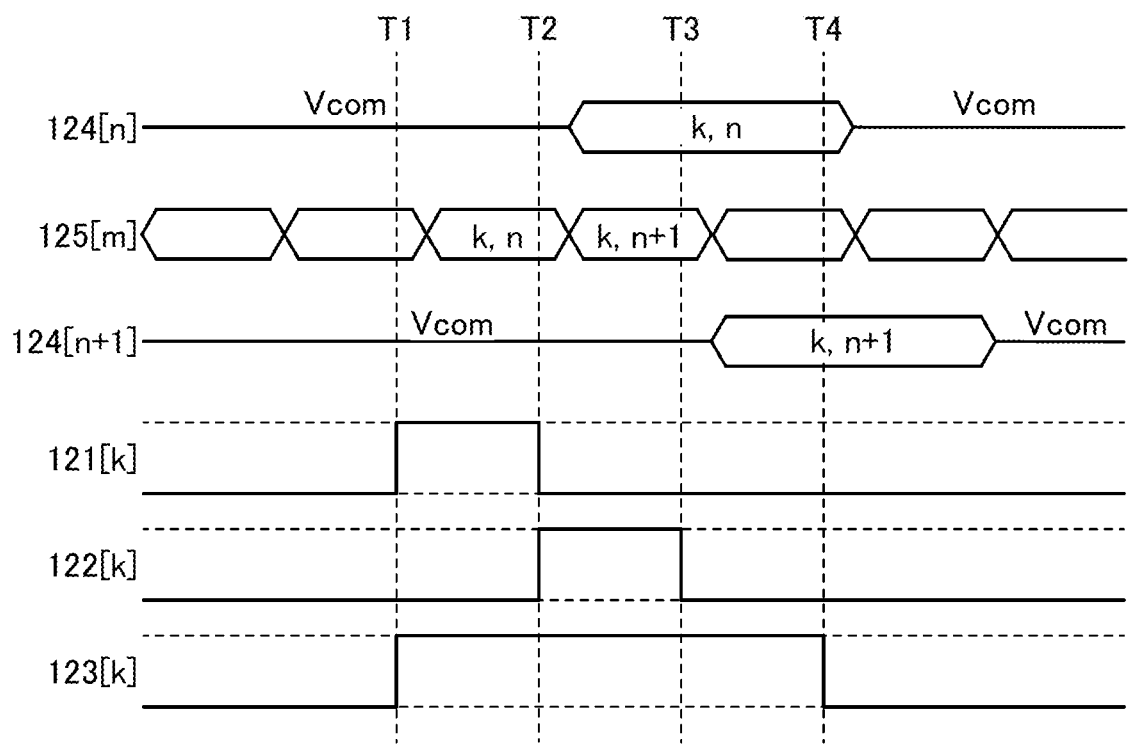

FIG. 4(B) shows an example different from the timing chart shown in FIG. 4(A). FIG. 4(B) is different from the timing chart shown in FIG. 4(A) in that the potential of the wiring 122[k] is "L" during Period T1-T2. By following the timing chart shown in FIG. 4(B), unnecessary driving in the pixel circuit 10[k, n+1] can be reduced.

Note that the operations in FIG. 4(A) and FIG. 4(B) can each be sequentially performed in one horizontal period.

An operation of correcting image data is described with reference to FIG. 5(A).

Figure 5A:
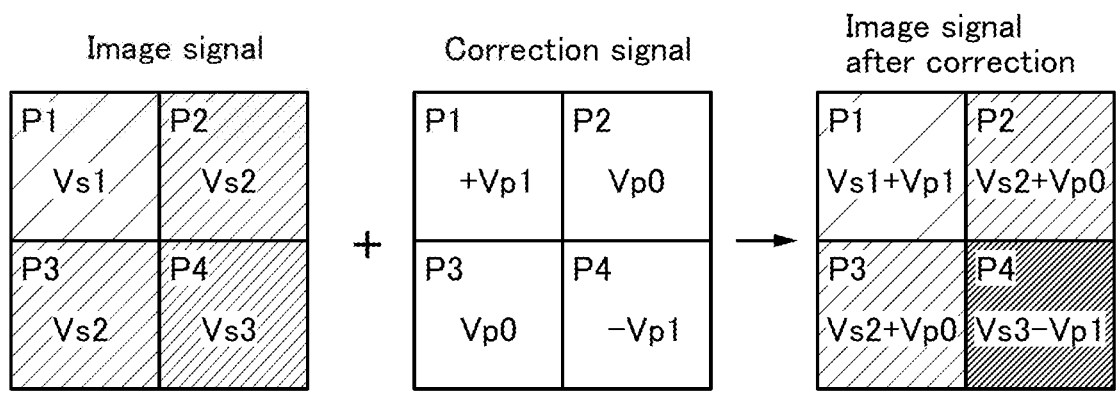
FIGS. 5A and 5B are drawings illustrating image data correction and image synthesis.

In diagrams in FIG. 5(A), input image data (Vs1, Vs2, and Vs3), input correction data (+Vp1, Vp0, and −Vp1), and generated image data after correction, for four pixels (P1 to P4) in the horizontal and perpendicular directions, are shown from the left. Note that in the following description, the display element can perform display such that the luminance becomes high when the potential of the image data is relatively high and the luminance becomes low when the potential of the image data is relatively low.

For example, in the pixel P1, the image data "Vs1" is combined with the positive correction data "+Vp1", making the image data "Vs1+Vp1" and increasing the luminance. In the pixels P2 and P3, the image data "Vs2" is combined with the correction data "Vp0" which causes substantially no correction, making the image data "Vs2+Vp0=Vs2" and keeping the luminance unchanged. In the pixel P4, the image data "Vs3" is combined with the negative correction data "−Vp1", making the image data "Vs3−Vp1" and decreasing the luminance.

Such a combination of the image data and the correction data enables, for example, upconversion, HDR display, correction of display unevenness unique to display devices, or correction of the threshold voltage of transistors included in pixels.

In an upconversion operation, the same image data is supplied to all the four pixels, for example. The pixels become capable of displaying different images when correction is performed. For example, data for one certain pixel in a display device that includes pixels corresponding to 4K2K is input to four certain pixels in a display device that includes pixels corresponding to 8K4K, so that display with higher resolution can be performed.

Figure 5B:
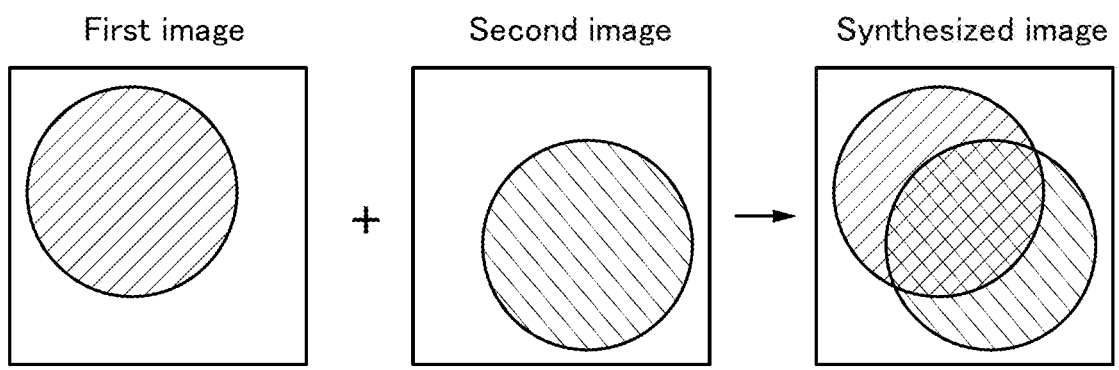

Different images superimposed on each other can be displayed, which is the correction of image data in a broad sense. FIG. 5(B) shows images of the entire display portion, i.e., from the left, a first image composed of the image data "Vs", a second image composed of the correction data "Vpa" and "Vpb", and an image synthesized from the first image and the second image.

Such a combination of the image data and the correction data enables display of an image synthesized from different images, improvement of the luminance of the entire displayed image, or the like. For example, the combination can be applied to insertion of a character, display of AR (Augmented Reality), or the like.

Figure 6A:
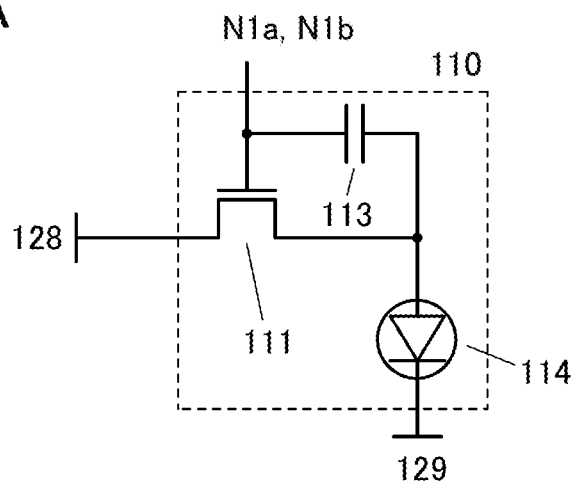
FIGS. 6A-6C are diagrams each illustrating a circuit block.
Figure 6B:
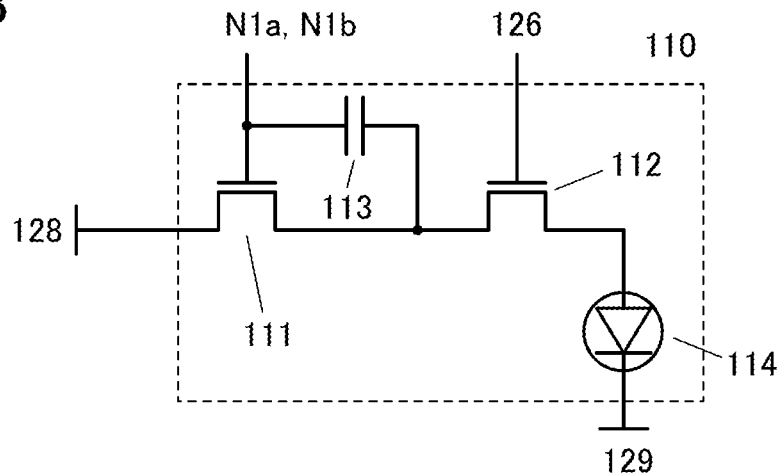
Figure 6C:
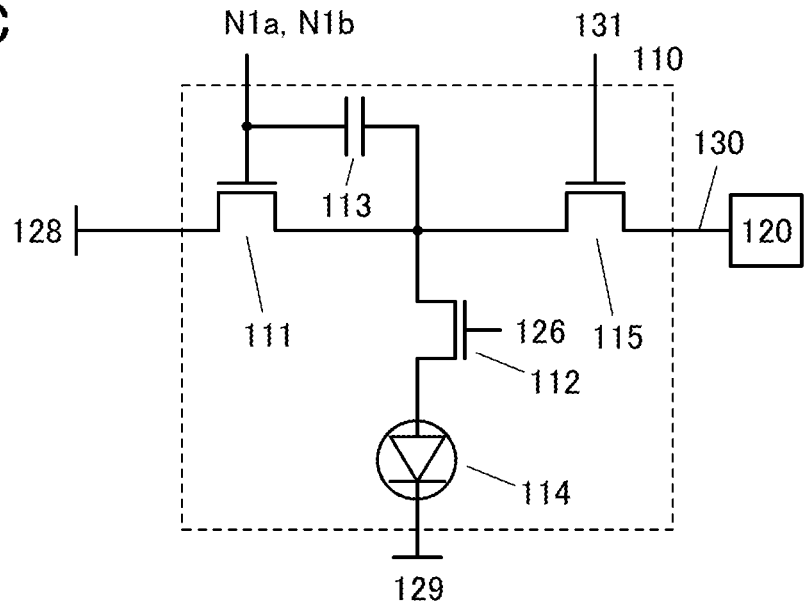

FIG. 6(A) to FIG. 6(C) each illustrate a structure example of the circuit block 110 including an EL element as the display element, which can be used as the circuit block 110a and the circuit block 110b.

The structure illustrated in FIG. 6(A) includes a transistor 111, a capacitor 113, and an EL element 114. One of a source and a drain of the transistor 111 is electrically connected to one electrode of the EL element 114. The one electrode of the EL element 114 is electrically connected to one electrode of the capacitor 113. The other electrode of the capacitor 113 is electrically connected to a gate of the transistor 111. The gate of the transistor 111 is electrically connected to the node N1a or the node N1b.

The other of the source and the drain of the transistor 111 is electrically connected to a wiring 128. The other electrode of the EL element 114 is electrically connected to a wiring 129. The wirings 128 and 129 have a function of supplying power. For example, the wiring 128 is capable of supplying a high potential power. The wiring 129 is capable of supplying a low potential power.

In the structure shown in FIG. 6(A), a current flows through the EL element 114 when the potential of the node N1a or the node N1b is equal to or higher than the threshold voltage of the transistor 111. Therefore, in some cases, the EL element 114 starts to emit light at Time T1 in the timing chart shown in FIG. 2(A), which might limit the applications.

FIG. 6(B) shows a structure in which a transistor 112 is added to the structure in FIG. 6(A). One of a source and a drain of the transistor 112 is electrically connected to the one of the source and the drain of the transistor 111. The other of the source and the drain of the transistor 112 is electrically connected to the EL element 114. A gate of the transistor 112 is electrically connected to a wiring 126. The wiring 126 can have a function of a signal line controlling the conduction of the transistor 112.

In this structure, a current flows through the EL element 114 when the transistor 112 is turned on and the potential of the node N1a or the node N1b is equal to or higher than the threshold voltage of the transistor 111. Therefore, the EL element 114 can start to emit light at or after Time T4 in the timing chart shown in FIG. 2(A), which is suitable for an operation involving correction.

FIG. 6(C) shows a structure in which a transistor 115 is added to the structure in FIG. 6(B). One of a source and a drain of the transistor 115 is electrically connected to the one of the source and the drain of the transistor 111. The other of the source and the drain of the transistor 115 is electrically connected to a wiring 130. A gate of the transistor 115 is electrically connected to a wiring 131. The wiring 131 can have a function of a signal line controlling the conduction of the transistor 115. Note that the gate of the transistor 115 may be electrically connected to the wiring 122.

The wiring 130 can be electrically connected to a supply source of a certain potential such as a reference potential. The certain potential is supplied from the wiring 130 to the one of the source and the drain of the transistor 111, whereby writing of the image data can be stable.

In addition, the wiring 130 can be connected to a circuit 120 and can also have a function of a monitor line. The circuit 120 can have one or more of the function of a supply source of the above certain potential, a function of obtaining electric characteristics of the transistor 111, and a function of generating the correction data.

In the case where the wiring 130 functions as a monitor line, the circuit 120 is capable of generating a potential for correcting the threshold voltage of the transistor 111 as the correction data "Vpa" and "Vpb".

Figure 7A:
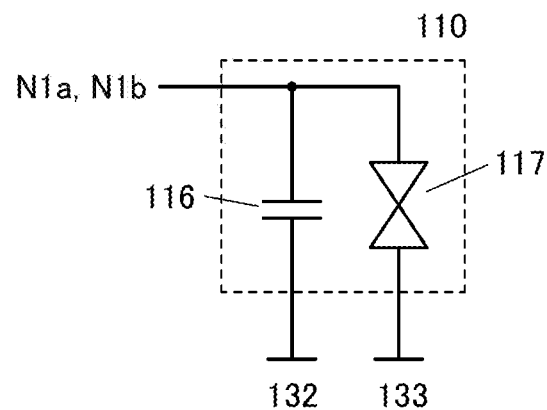
FIGS. 7A-7C are diagrams each illustrating a circuit block.
Figure 7B:
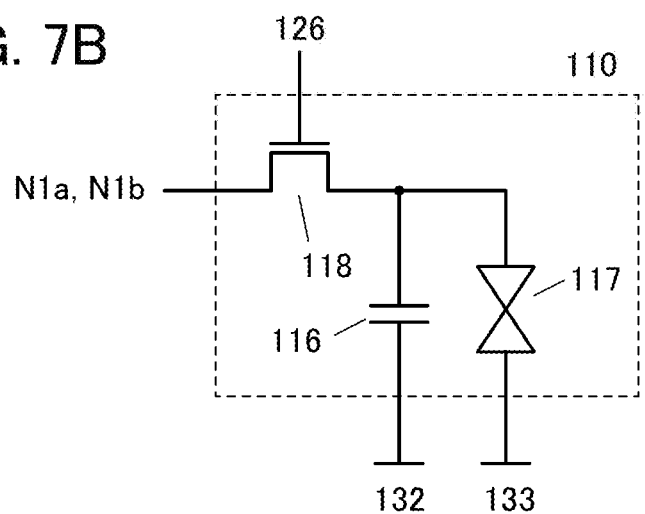
Figure 7C:
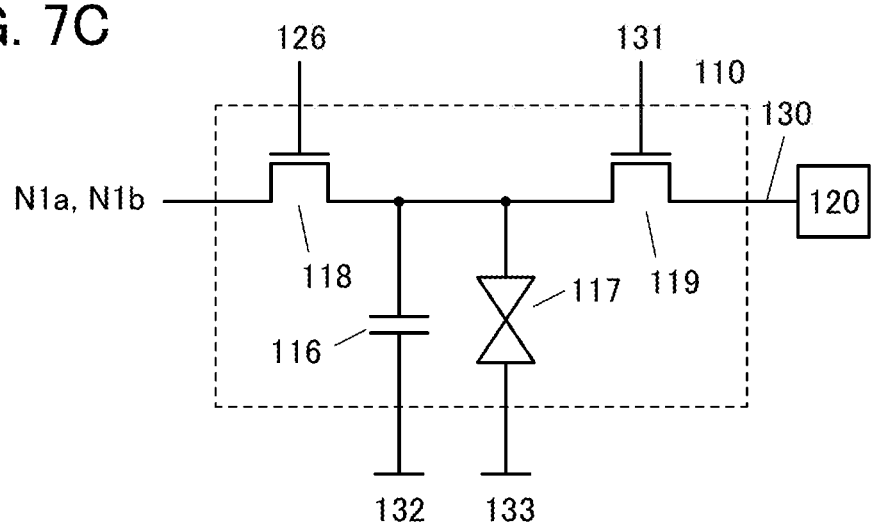

FIG. 7(A) to FIG. 7(C) each illustrate a structure example of the circuit block 110 including a liquid crystal element as the display element, which can be used as the circuit block 110a and the circuit block 110b.

The structure illustrated in FIG. 7(A) includes a capacitor 116 and a liquid crystal element 117. One electrode of the liquid crystal element 117 is electrically connected to one electrode of the capacitor 116. The one electrode of the capacitor 116 is electrically connected to the node N1a or the node N1b.

The other electrode of the capacitor 116 is electrically connected to a wiring 132. The other electrode of the liquid crystal element 117 is electrically connected to a wiring 133. The wirings 132 and 133 have a function of supplying power. For example, the wirings 132 and 133 are capable of supplying a reference potential such as GND or 0 V or a given potential.

In this structure, the liquid crystal element 117 starts to operate when the potential of the node N1a or the node N1b is equal to or higher than the operation threshold of the liquid crystal element 117. Therefore, in some cases, the display operation starts at Time T1 in the timing chart shown in FIG. 2(A), which might limit the applications. Note that in the case of a transmissive liquid crystal display device, however, a possible unnecessary display operation can be made less visible when the operation of, for example, turning off a backlight until Time T4 in FIG. 2(A) is combined.

FIG. 7(B) shows a structure in which a transistor 118 is added to the structure in FIG. 7(A). One of a source and a drain of the transistor 118 is electrically connected to the one electrode of the capacitor 116. The other of the source and the drain of the transistor 118 is electrically connected to the node N1a or the node N1b. A gate of the transistor 118 is electrically connected to the wiring 126. The wiring 126 can have a function of a signal line controlling the conduction of the transistor 118.

In this structure, the potential of the node N1a or the node N1b is applied to the liquid crystal element 117 when the transistor 118 is turned on. Therefore, the liquid crystal element can start to operate at or after Time T4 in the timing chart shown in FIG. 2(A), which is suitable for an operation involving correction.

While the transistor 118 is in a non-conduction state, the potentials supplied to the capacitor 116 and the liquid crystal element 117 are held continuously; thus, the potentials supplied to the capacitor 116 and the liquid crystal element 117 are preferably reset before the image data is rewritten. For this reset, a reset potential is supplied to the wiring 124 and the transistor 118 is turned on at the same time, for example.

FIG. 7(C) shows a structure in which a transistor 119 is added to the structure in FIG. 7(B). One of a source and a drain of the transistor 119 is electrically connected to the one electrode of the liquid crystal element 117. The other of the source and the drain of the transistor 119 is electrically connected to the wiring 130. A gate of the transistor 119 is electrically connected to the wiring 131. The wiring 131 can have a function of a signal line controlling the conduction of the transistor 119. Note that the gate of the transistor 119 may be electrically connected to the wiring 122.

The circuit 120 electrically connected to the wiring 130 is as described above using FIG. 6(C) and also may have a function of resetting the potentials supplied to the capacitor 116 and the liquid crystal element 117.

Figure 8A:
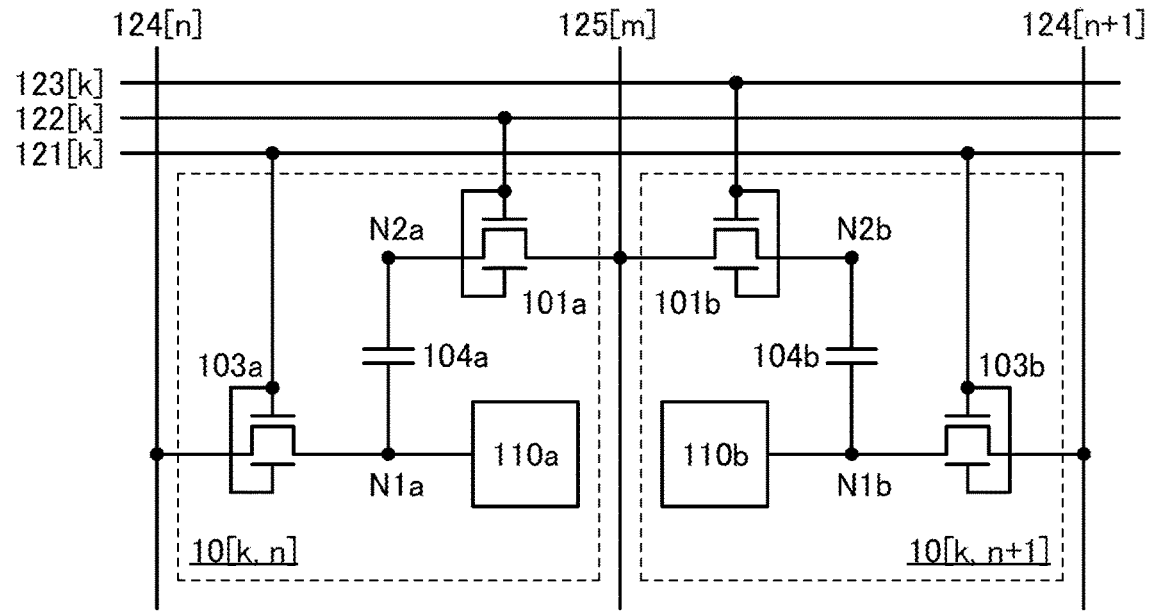
FIGS. 8A and 8B are diagrams each illustrating a pixel circuit.
Figure 8B:
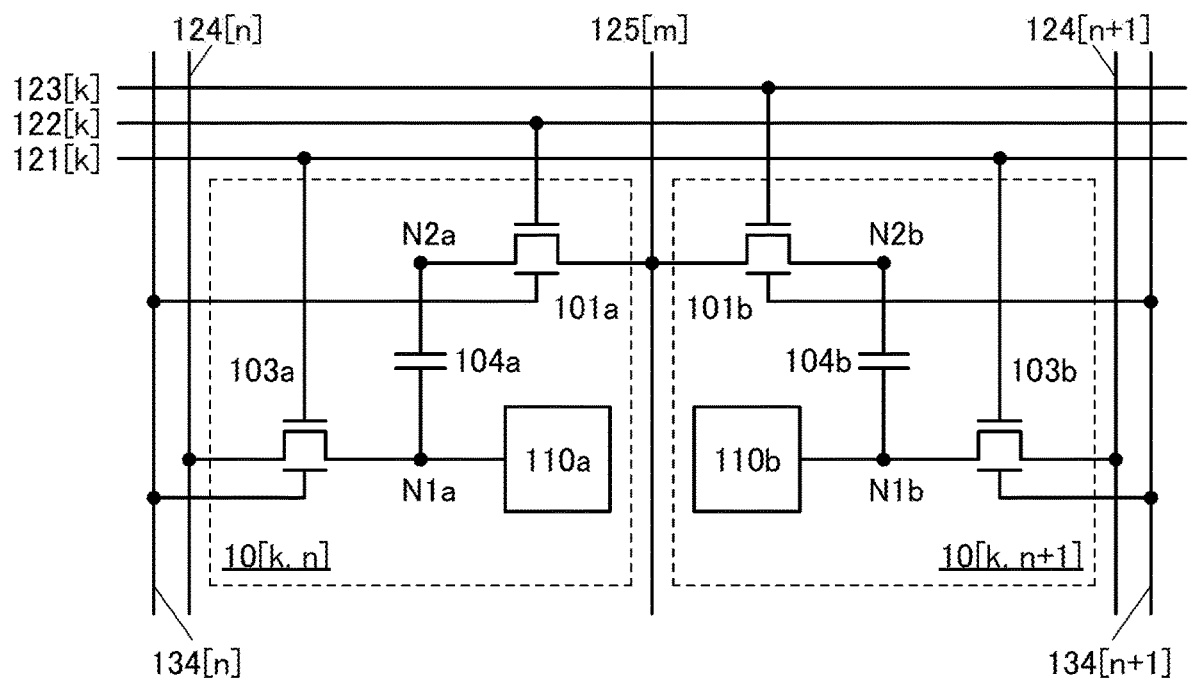

As shown in FIG. 8(A) and FIG. 8(B), the transistor 101a, the transistor 103a, the transistor 101b, and the transistor 103b may each have a back gate. FIG. 8(A) shows a structure in which the back gates are electrically connected to the front gates, which has an effect of increasing on-state currents. FIG. 8(B) shows a structure in which the back gates are electrically connected to a wiring 134 capable of supplying a constant potential, which enables the threshold voltages of the transistors to be controlled. Note that a back gate may also be provided in the transistor included in the circuit block 110 in FIG. 6(A) to FIG. 6(C) and FIG. 7(A) to FIG. 7(C).

Figure 9A:
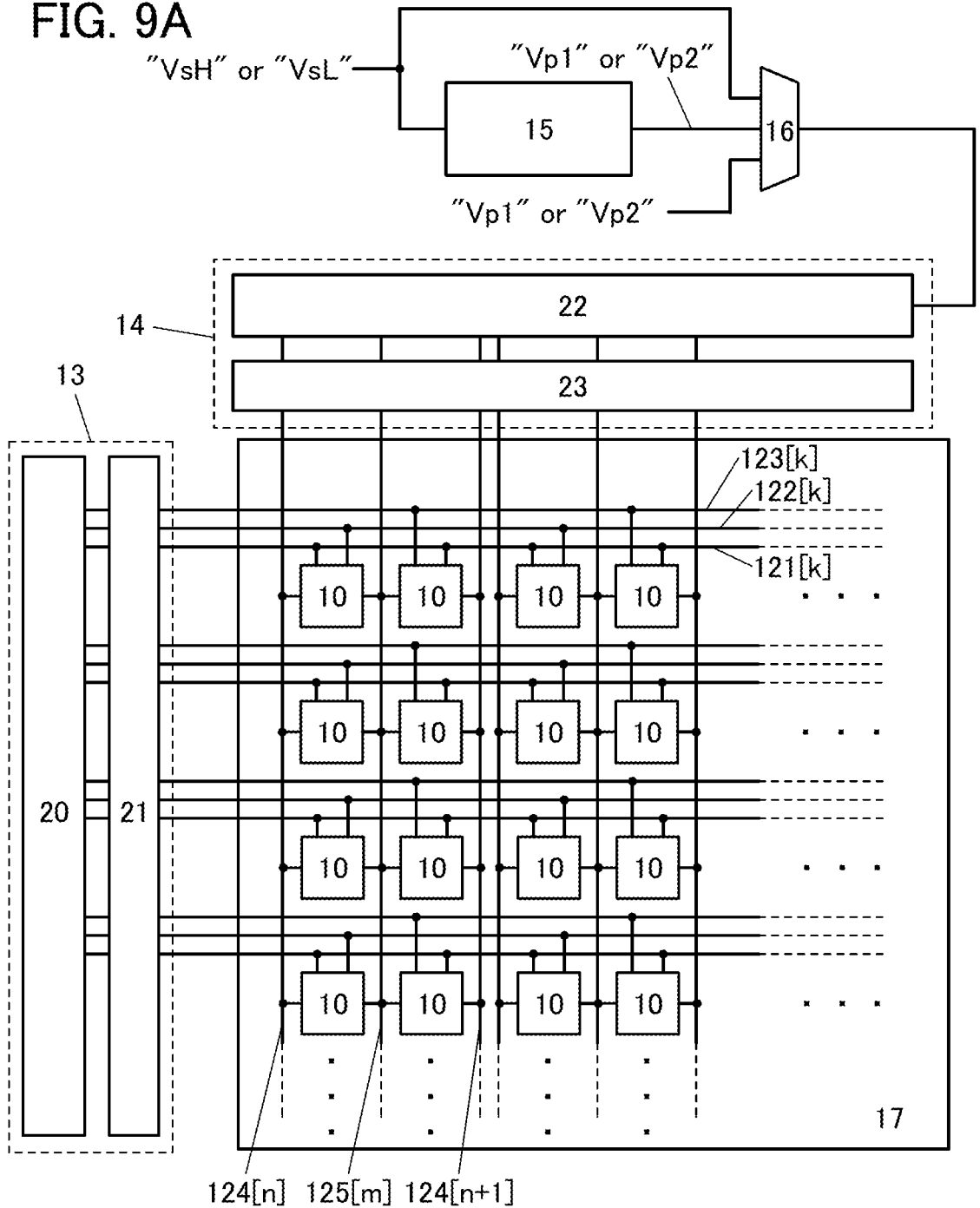
FIGS. 9A-9C are block diagrams illustrating a display device.

FIG. 9(A) is an example of a block diagram of the display device of one embodiment of the present invention. The display device includes a pixel array 17 where the pixel circuits 11 are arranged in a matrix, a row driver 13, a column driver 14, a circuit 15, and a selection circuit 16.

The row driver 13 can have a structure in which a shift register 20 and a buffer circuit 21 are combined, for example. When the conduction of the buffer circuit 21 is controlled, data can be output to the wiring 121 or the wiring 122.

The column driver 14 can have a structure in which a shift register 22 and a buffer circuit 23 are combined, for example. When the conduction of the buffer circuit 23 is controlled, data can be output to the wiring 124 or the wiring 125.

The circuit 15 has a function of generating the correction data. Note that the circuit 15 can also be referred to as an external device for generating the correction data.

The row driver 13 is capable of controlling the conduction of the transistor 101a, the transistor 103a, the transistor 101b, and the transistor 103b. The column driver 14 is capable of supplying the correction data or the image data to the wiring 124 or the wiring 125.

Image data "VsH" for high resolution (e.g., 8K4K data) or image data "VsL" for low resolution (e.g., 4K2K data) is input to the circuit 15. When the image data "VsH" is input, the correction data "Vp1" is generated; when the image data "VsL" is input, the correction data "Vp2" is generated.

The selection circuit 16 is capable of outputting the correction data "Vp1" and "Vp2" generated outside or the image data "VsH" and "VsL", in addition to the correction data "Vp1" and "Vp2" generated in the circuit 15, to the column driver 14.

In the structure shown in FIG. 9(A), for example, output stages of each driver can be halved in the case where a low-resolution display operation without correction is performed, which can reduce power consumption.

The circuit 15 may also include a neural network. For example, the use of a deep neural network that has learned a huge number of images as teacher data allows generation of highly accurate correction data.

Figure 10A:
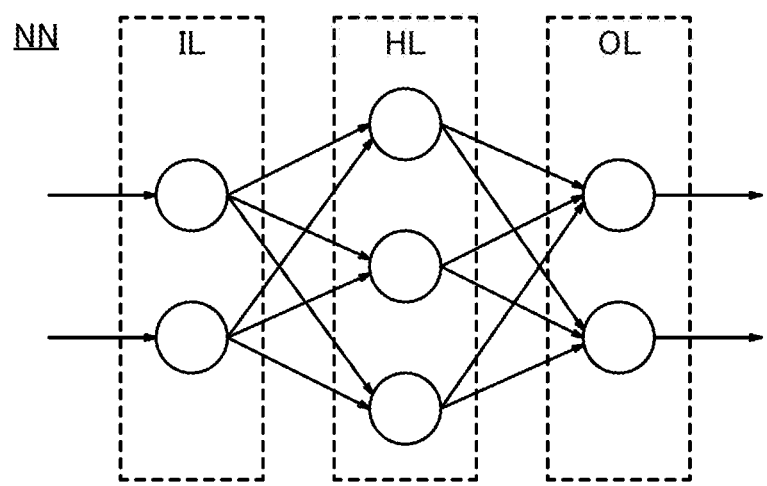
FIGS. 10A and 10B are diagrams illustrating a configuration example of a neural network.

As shown in FIG. 10(A), a neural network NN can be formed of an input layer IL, an output layer OL, and a middle layer (hidden layer) HL. The input layer IL, the output layer OL, and the middle layer HL each include one or more neurons (units). The number of middle layers HL may be one, or two or more. A neural network including two or more middle layers HL can also be referred to as a DNN (deep neural network), and learning using a deep neural network can also be referred to as deep learning.

Input data is input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 10B:
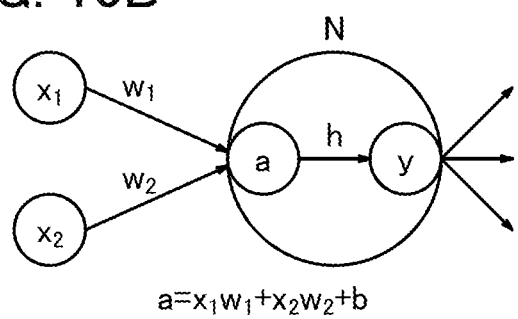

FIG. 10(B) shows an example of an operation with the neurons. Here, a neuron N and two neurons in the previous layer which output signals to the neuron N are shown. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=h(a) is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum operation circuit can be used. As this product-sum operation circuit, a digital circuit may be used or an analog circuit may be used.

The product-sum operation circuit may be formed using a Si transistor or an OS transistor. An OS transistor is particularly preferably used as a transistor included in an analog memory of the product-sum operation circuit because of its extremely low off-state current. Note that the product-sum operation circuit may be formed using both a Si transistor and an OS transistor.

Figure 9B:
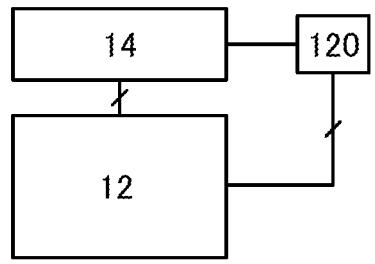
Figure 9C:
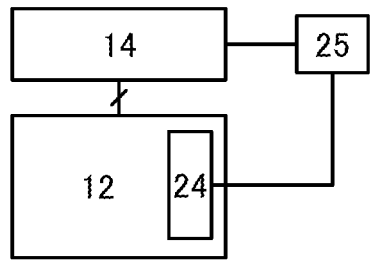

Note that the correction data can be generated not only in the circuit 15 but also in the circuit 120 described above (see FIG. 9(B)). The correction data may be generated on the basis of data obtained by reading the luminance of grayscale display in a display portion with a luminance meter or data obtained by reading a photograph of the display. A sensor 24 capable of sensing the luminance of the display and a circuit 25 capable of generating the correction data by sensing deterioration of the display element may be provided (see FIG. 9(C)).

Figure 11:
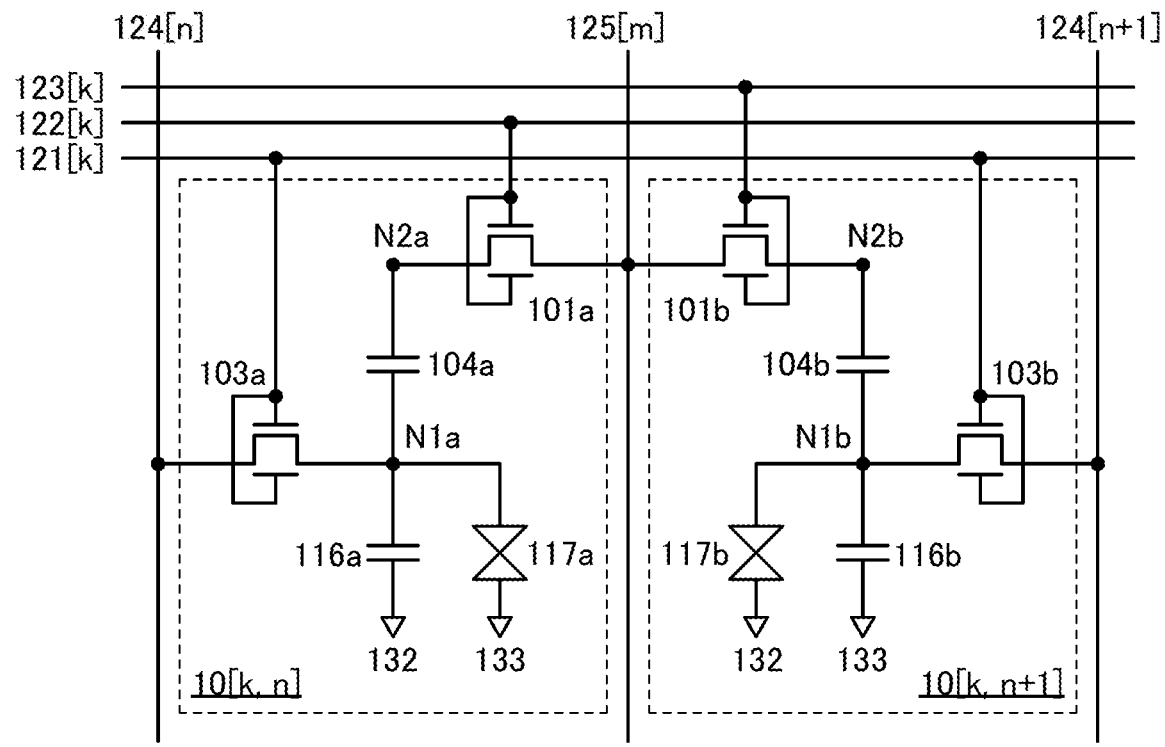
FIG. 11 is a diagram illustrating a structure of a pixel array used for simulation.

Simulation results are described, in which the circuit block shown in FIG. 7(A) is used for the pixel circuit 10[k, n] and the pixel circuit 10[k, n+1] shown in FIG. 1 (see FIG. 11).

All the transistors have a size of L/W=4 μm/4 μm; the capacitance of the capacitor 104a and the capacitor 104b is 100 fF; the capacitance of the capacitor 116a and the capacitor 116b is 50 fF; the capacitance of the liquid crystal element 117a and the liquid crystal element 117b is 20 fF; and the potentials of a common wiring 132 and a common wiring 133 are 0 V Note that SPICE is used as circuit simulation software.

FIG. 12(A) to FIG. 12(C) and FIG. 13(A) to FIG. 13(C) show the simulation results of operations of the pixel circuit 10[k, n] and the pixel circuit 10[k, n+1]. In FIG. 12(A) to FIG. 12(C) and FIG. 13(A) to FIG. 13(C), the vertical axis represents potentials of respective wirings, and the horizontal axis represents time according to the timing charts.

Figure 12A:
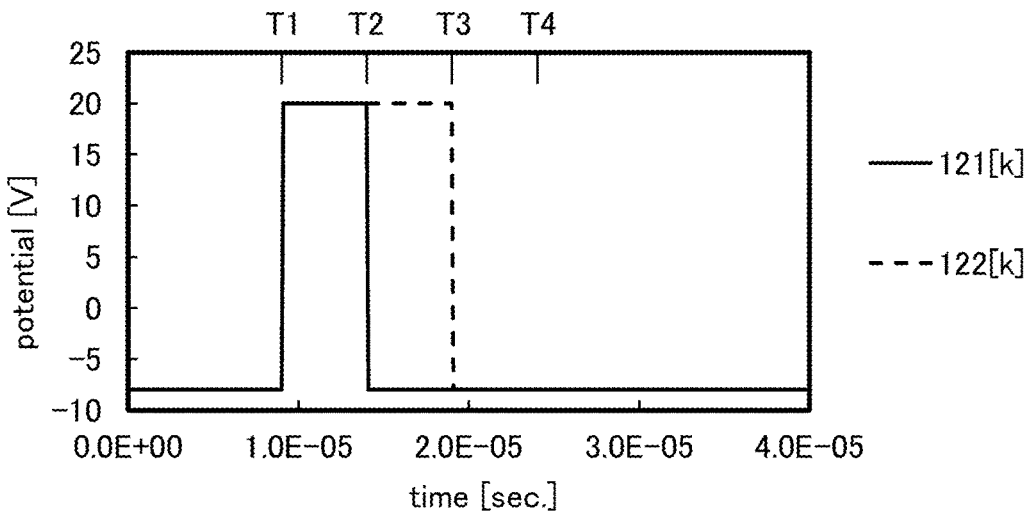
FIGS. 12A-12C are diagrams showing simulation results.
Figure 12B:
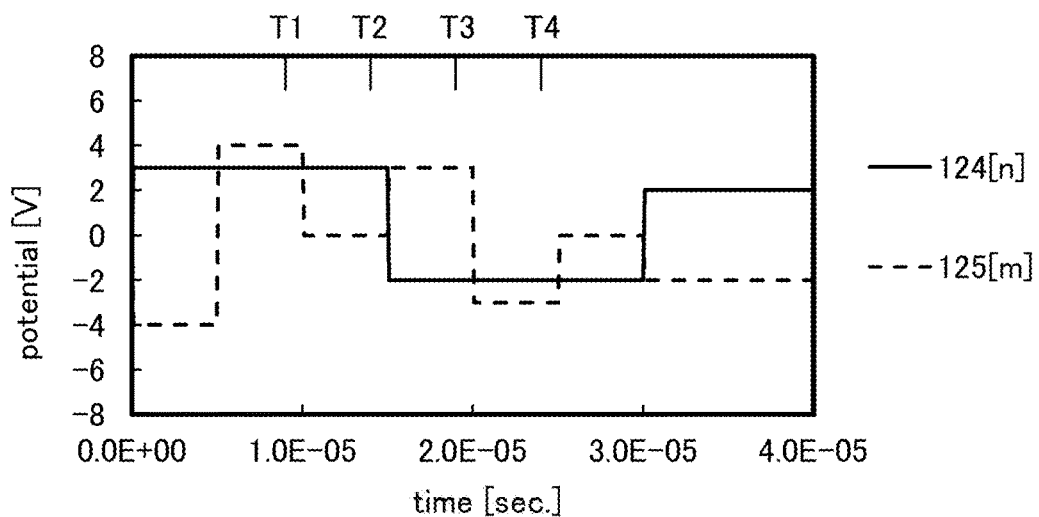
Figure 12C:
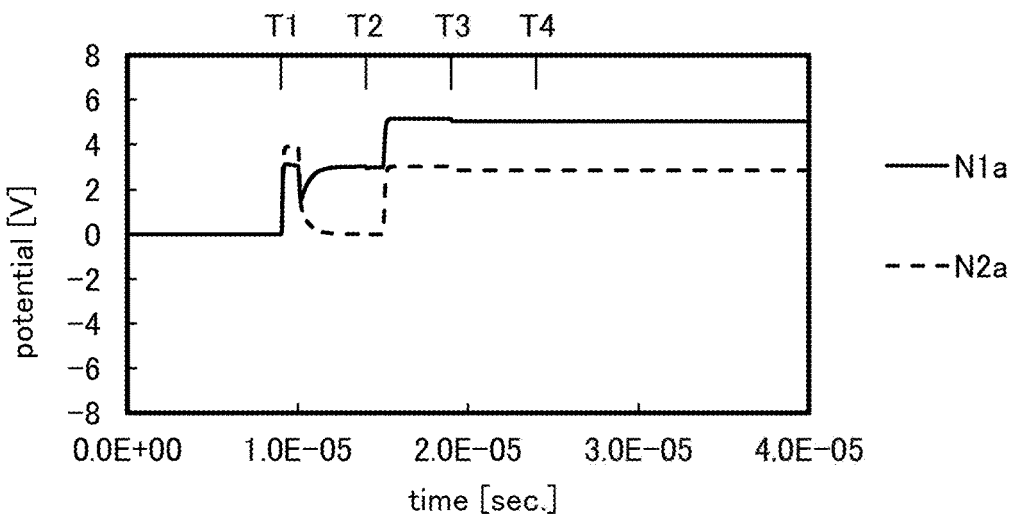

FIG. 12(A) shows the potentials of the wiring 121[k] and the wiring 122[k] that are connected to the gates of the transistor 101a and the transistor 103a in the pixel circuit 10[k, n]. FIG. 12(B) shows the potentials of the wiring 124[n] that supplies the correction data "Vpa" and the wiring 125[m] that supplies the image data "Vs". FIG. 12(C) shows the simulation result showing the potentials of the node N1a and the node N2a in the pixel circuit 10[k, n].

Figure 13A:
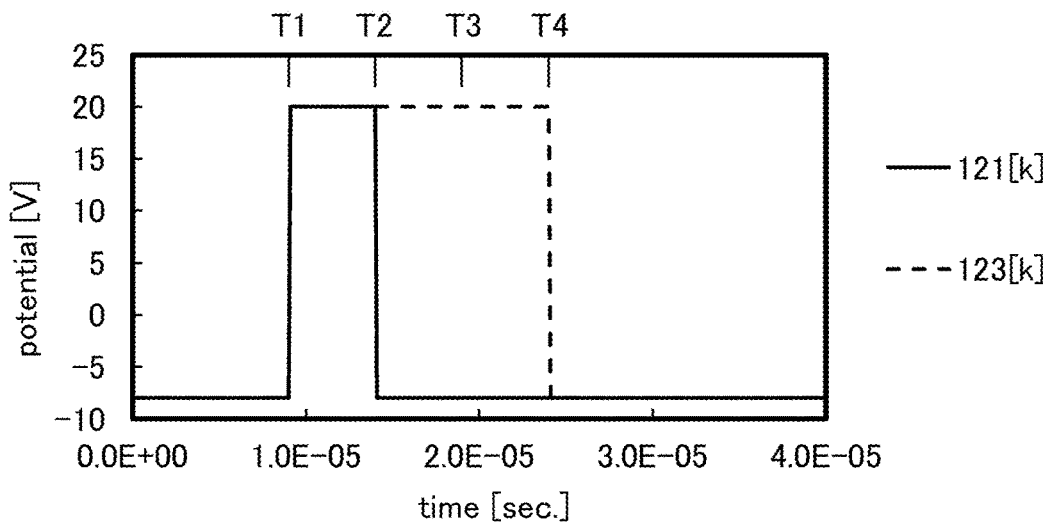
FIGS. 13A-13C are diagrams showing simulation results.
Figure 13B:
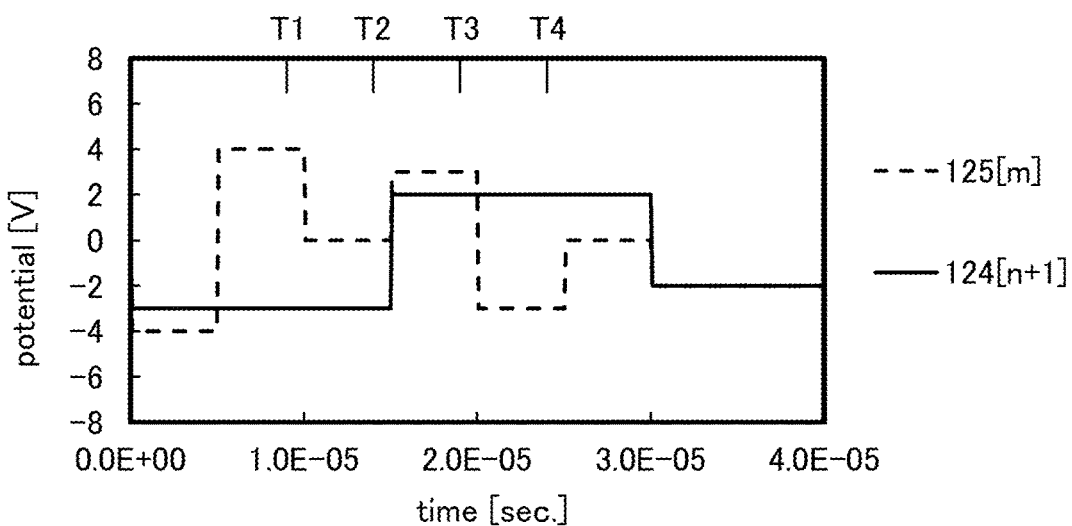
Figure 13C:
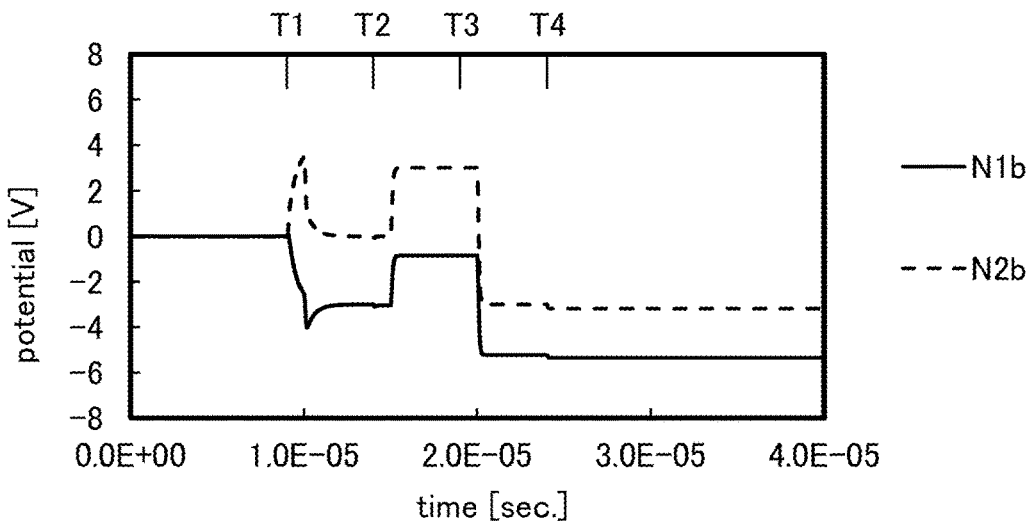

FIG. 13(A) shows the potentials of the wiring 121[k] and the wiring 123[k] that are connected to the gates of the transistor 101b and the transistor 103b in the pixel circuit 10[k, n+1]. FIG. 13(B) shows the potentials of the wiring 124[n+1] that supplies the correction data "Vpb" and the wiring 125[m] that supplies the image data "Vs". FIG. 13(C) shows the simulation result showing the potentials of the node N1b and the node N2b in the pixel circuit 10[k, n+1].

As shown in FIG. 12(C), it is confirmed that, in the pixel circuit 10[k, n], the potential of the potential (Vpa) of the wiring 124[n] is written to the node N1a during Period T1-T2, and the potential of the node N1a is increased by capacitive coupling during Period T2-T3. As shown in FIG. 13(C), it is confirmed that, in the pixel circuit 10[k, n+1], the potential of the potential (Vpb) of the wiring 124[n+1] is written to the node N1b during Period T1-T2, and the potential of the node N1b is decreased by capacitive coupling during Period T3-T4.

Figure 14:
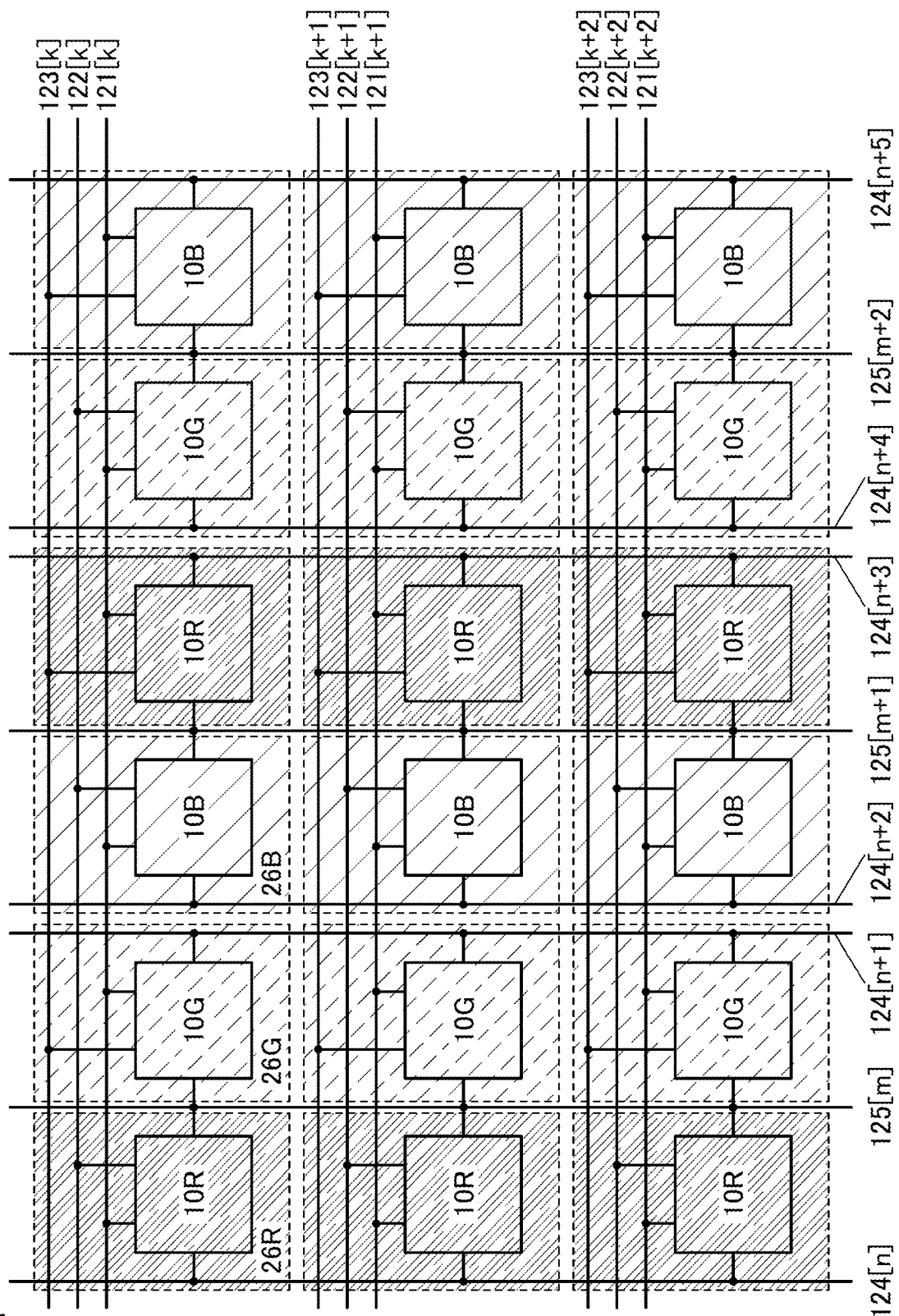
FIG. 14 is a diagram illustrating a pixel configuration.

FIG. 14 shows an example of the case in which a pixel of one embodiment of the present invention is used for an EL display device capable of color display. A pixel of a display device capable of color display generally includes a combination of subpixels that emit colors of R (red), G (green), and B (blue). In FIG. 14, one pixel consists of subpixels of three colors, a subpixel circuit 10R, a subpixel circuit 10G, and a subpixel circuit 10B arranged in the horizontal direction, and six pixels are arranged in total: two pixels in the horizontal direction by three pixels in the perpendicular direction. As described above, in one embodiment of the present invention, adjacent pixels can share the wiring 125.

In a stripe arrangement, although subpixels are preferably arranged at regular distances, a constant distance between subpixels (a distance between components having the same function) might be difficult to ensure in the case where a wiring or a transistor is sheared by the subpixels Thus, when electrodes 26R, 26G, and 26B are pixel electrodes connected to the subpixel circuit 10R, the subpixel circuit 10G, and the subpixel circuit 10B, respectively, the electrodes 26R, 26G, and 26B are preferably arranged at regular distances as shown in FIG. 14. Note that here for simple description, the pixel electrode is assumed as a different component although can also be assumed as a component of the corresponding subpixel. This structure is effective for a top-emission EL display device or a reflective liquid crystal display device.

Figure 15:
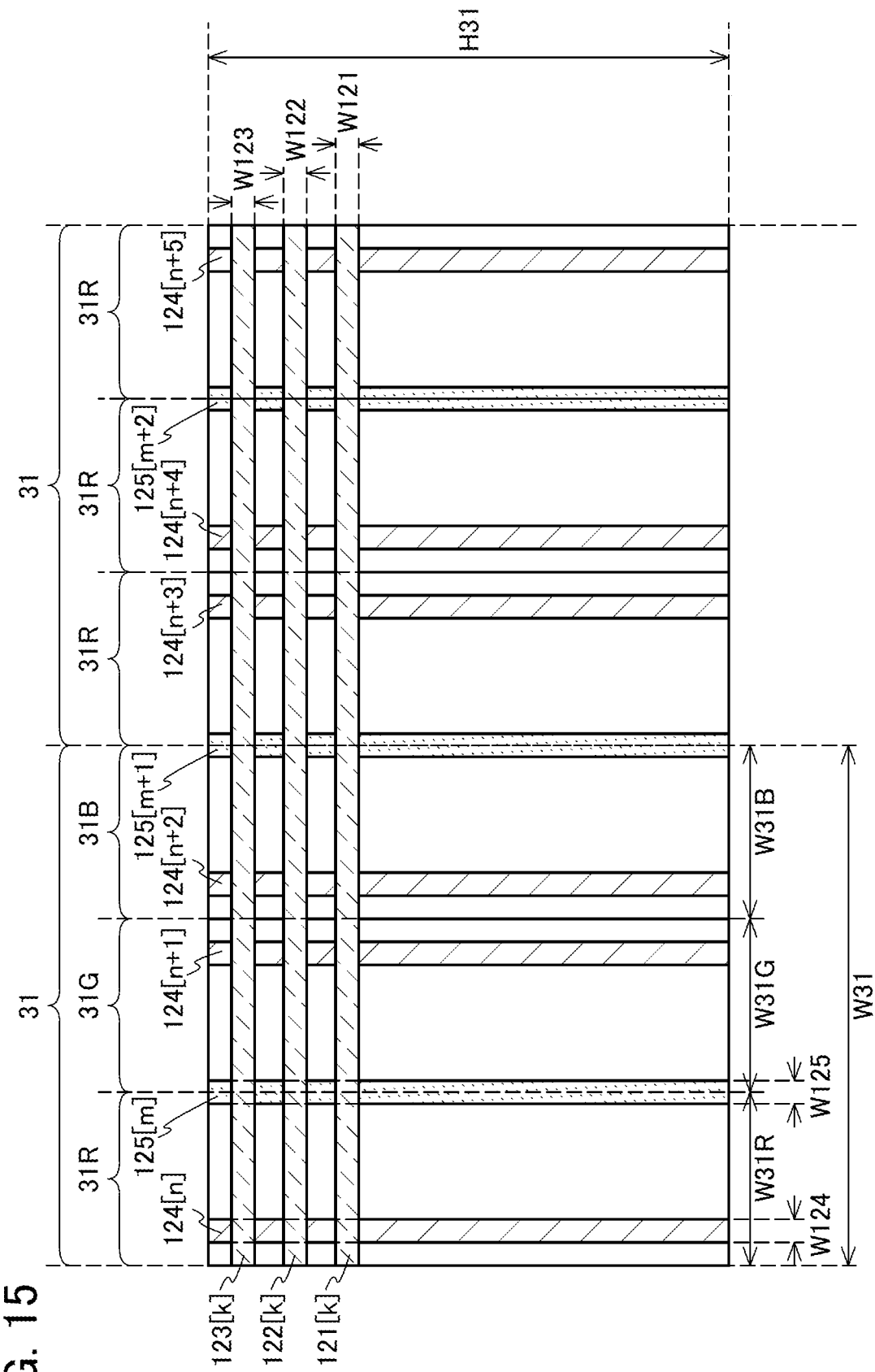
FIG. 15 is a diagram for explaining the aperture ratio of a pixel.

Here, the aperture ratio of a pixel is described with reference to FIG. 15. FIG. 15 is an example of a layout of pixels to which one embodiment of the present invention is applied. An example is shown in which one pixel 31 consists of three pixels of different colors, a subpixel 31R, a subpixel 31G, and a subpixel 31B arranged in the horizontal direction, and two pixels (six subpixels) are arranged in total: two pixels in the horizontal direction by one pixel in the perpendicular direction. For simple description, FIG. 15 shows only the wiring 121, the wiring 122, the wiring 123, the wiring 124, and the wiring 125, and the pixel circuit is omitted.

When the areas occupied by the wiring 121, the wiring 122, the wiring 123, the wiring 124, and the wiring 125 are large, the aperture ratio of the pixel might be low. Therefore, in the pixel, the areas occupied by the wiring 121, the wiring 122, the wiring 123, the wiring 124, and the wiring 125 are preferably small.

In FIG. 15, the length of the pixel 31 in the perpendicular direction is H31, and the length in the horizontal direction is W31. The lengths of the subpixel 31R, the subpixel 31G, and the subpixel 31B in the horizontal direction are W31R, W31G, and W31B, respectively. FIG. 15 illustrates an example in which W31R, W31G, and W31B are equal to each other. In addition, in the example, H31 and W31 are equal to each other, that is, the pixel 31 is a square. Thus, in FIG. 15, W31R, W31G, and W31B are each equal to one third of H31.

The areas occupied by the wirings are described using the subpixel 31R. As described above, in one embodiment of the present invention, the adjacent subpixel 31R and subpixel 31G share the wiring 125[m], and three wirings, the wiring 121[k], the wiring 122[k], and the wiring 123[k] in the horizontal direction are included. Since the wiring 125[m] is shared, in the case where one wiring in the horizontal direction, e.g., the wiring 123[$k$], is added, the area occupied by the wiring 123 in one subpixel is W31R×W123. Since the wiring 125[$m$] is shared, the area occupied by the wiring 125[$m$] in one subpixel is H31×W124÷2. Accordingly, when W123 equals W125, a reduced area H31×W124÷2 is larger than an increased area W31R×W123, so that the area occupied by the wirings in a pixel can be small. That is, in one embodiment of the present invention, the aperture ratio of a pixel can be increased.

This embodiment can be implemented in combination with any of the structures described in the other embodiments and the like, as appropriate.

Embodiment 2

In this embodiment, a structure example of a display device using a liquid crystal element and a structure example of a display device using an EL element are described. Note that the description of the components, operations, and functions of the display device described in Embodiment 1 is omitted in this embodiment.

Figure 16A:
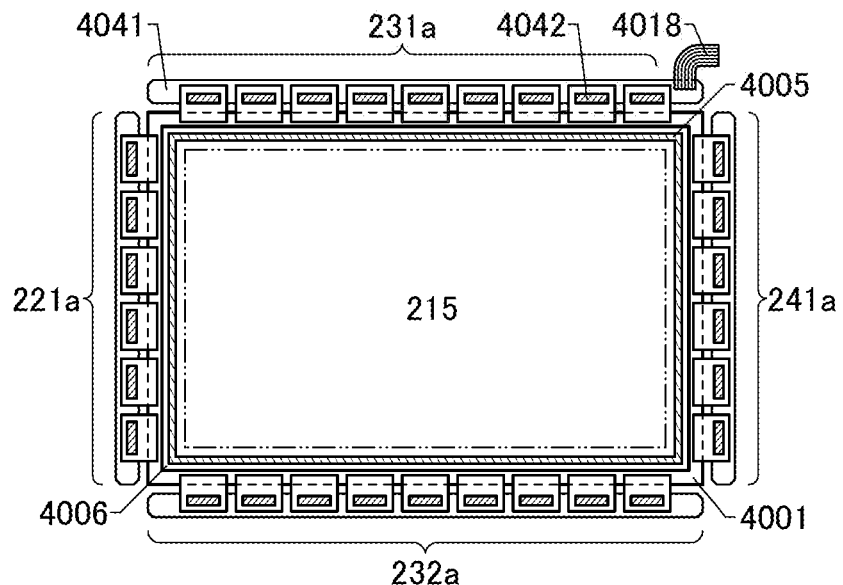
FIGS. 16A-16C are diagrams each illustrating a display device.
Figure 16B:
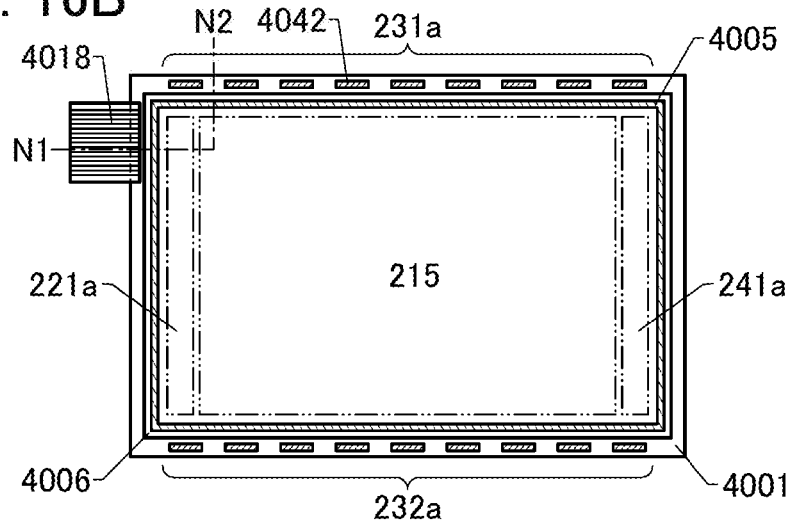
Figure 16C:
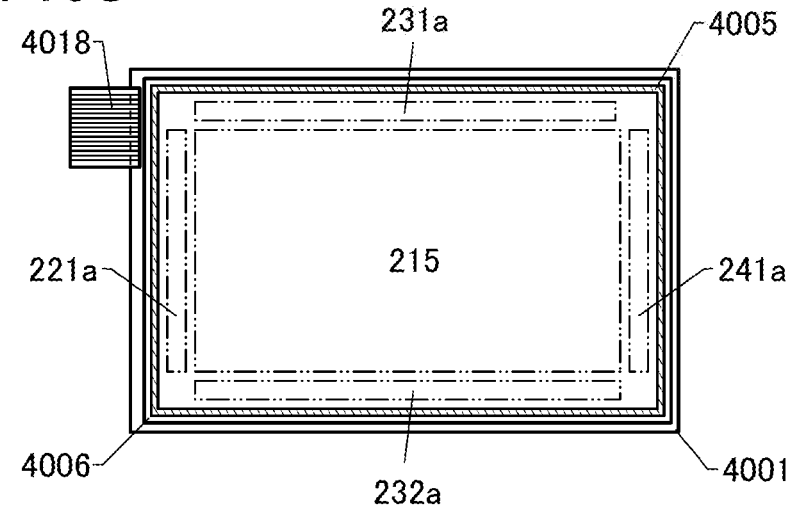

FIG. 16(A) to FIG. 16(C) are diagrams each illustrating a structure of a display device in which one embodiment of the present invention can be used.

In FIG. 16(A), a sealant 4005 is provided to surround a display portion 215 provided over a first substrate 4001, and the display portion 215 is sealed with the sealant 4005 and a second substrate 4006.

The pixel array described in Embodiment 1 can be provided in the display portion 215. Note that a scan line driver circuit and a signal line driver circuit which are described below correspond to the row driver and the column driver, respectively.

In FIG. 16(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each have a function of the column driver described in Embodiment 1. The scan line driver circuit 221a has a function of the row driver described in the embodiment. The common line driver circuit 241a has a function of supplying a predetermined potential to the wiring described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 16(B) shows an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example shown in FIG. 16(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 16(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example shown in FIG. 16(B), one embodiment of the present invention is not limited to this structure. The scan line driver circuit may be separately formed and then mounted, or part of the signal line driver circuits or part of the scan line driver circuits may be separately formed and then mounted. The signal line driver circuit 231a and the signal line driver circuit 232a may be formed over the same substrate as the display portion 215, as shown in FIG. 16(C).

In some cases, the display device encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may have the same structure, or two or more kinds of structures may be used in combination. Similarly, the transistors included in the pixel circuits may have the same structure, or two or more kinds of structures may be used in combination.

An input device 4200 can be provided over the second substrate 4006. The display devices illustrated in FIG. 16 and provided with the input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 17A:
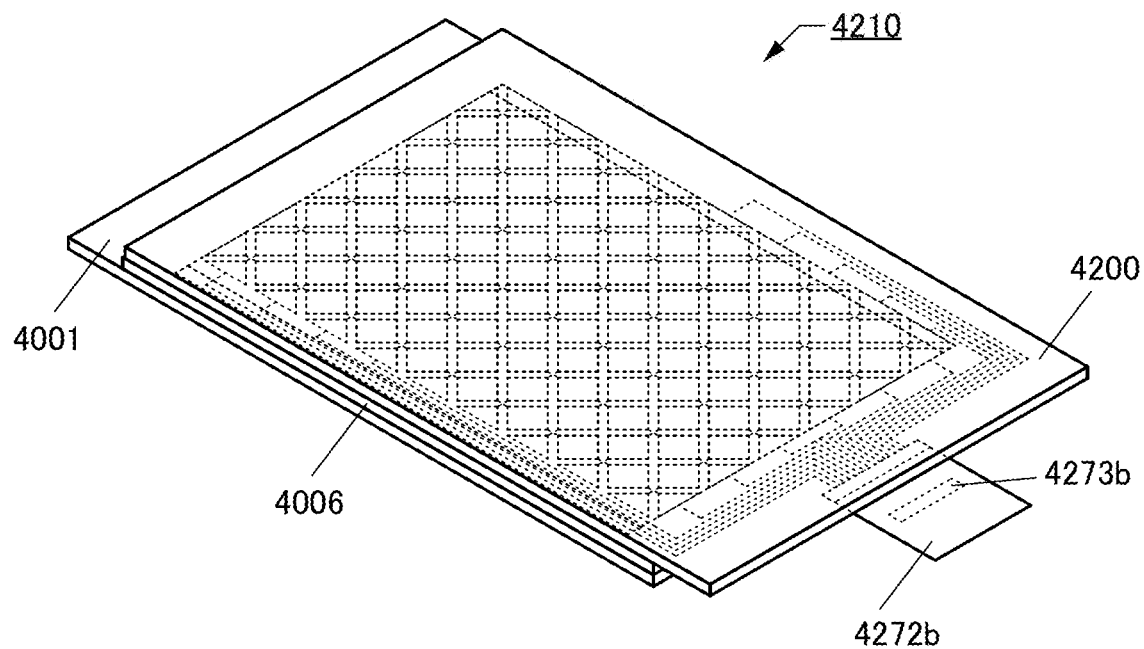
FIGS. 17A and 17B are diagrams illustrating a touch panel.
Figure 17B:
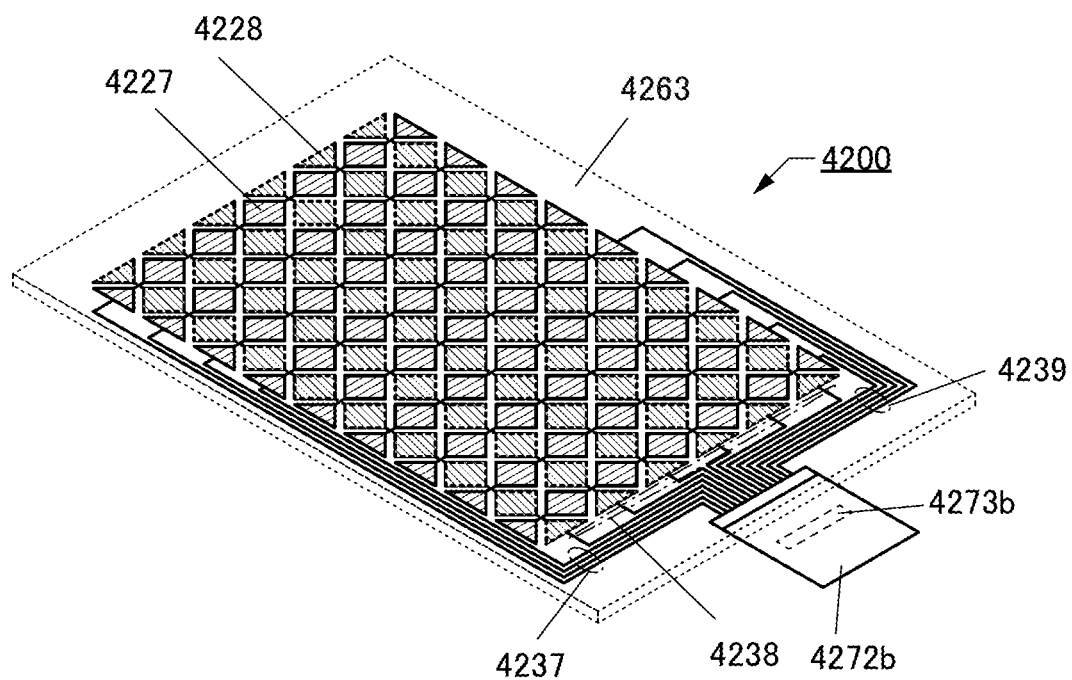

FIG. 17(A) and FIG. 17(B) show an example of the touch panel. FIG. 17(A) is a perspective view of a touch panel 4210. FIG. 17(B) is a schematic perspective view of the input device 4200. Note that for clarity, only typical components are shown.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIG. 18(A) and FIG. 18(B) are cross-sectional views of a portion indicated by chain line N1-N2 in FIG. 16(B). Display devices shown in FIG. 18(A) and FIG. 18(B) each include an electrode 4015, and the electrode 4015 is electrically connected to a terminal included in the FPC 4018 through an anisotropic conductive layer 4019. In FIG. 18(A) and FIG. 18(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIG. 18(A) and FIG. 18(B), the transistor 4010 included in the display portion 215 and the transistor 4011 included in the scan line driver circuit 221a are shown as an example. In the examples shown in FIG. 18(A) and FIG. 18(B), the transistor 4010 and the transistor 4011 are bottom-gate transistors but may be top-gate transistors.

In FIG. 18(A) and FIG. 18(B), the insulating layer 4112 is provided over the transistor 4010 and the transistor 4011. In FIG. 18(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display devices shown in FIG. 18(A) and FIG. 18(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set in consideration of the off-state current of the transistors or the like.

The transistor 4010 provided in the display portion 215 is electrically connected to the display element. FIG. 18(A) shows an example of a liquid crystal display device using a liquid crystal element as the display element. In FIG. 18(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device shown in FIG. 18(A), a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display devices shown in FIG. 18(A) and FIG. 18(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected from the cathode side. The injected electrons and holes are recombined in the EL layer and the light-emitting compound contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

In addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate. The light-emitting element can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting element having any of the emission structures can be used.

FIG. 18(B) shows an example of a light-emitting display device using a light-emitting element as the display element (also referred to as an "EL display device"). A light-emitting element 4513 serving as the display element is electrically connected to the transistor 4010 provided in the display portion 215. The structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material included in the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. When the light-emitting element 4513 has a microcavity structure in the latter method, the color purity can be further increased.

The light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylicbased resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

The first electrode layer 4030 and the second electrode layer 4031 can be formed using a conductive composition including a conductive high molecule (also referred to as a conductive polymer). As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 19:
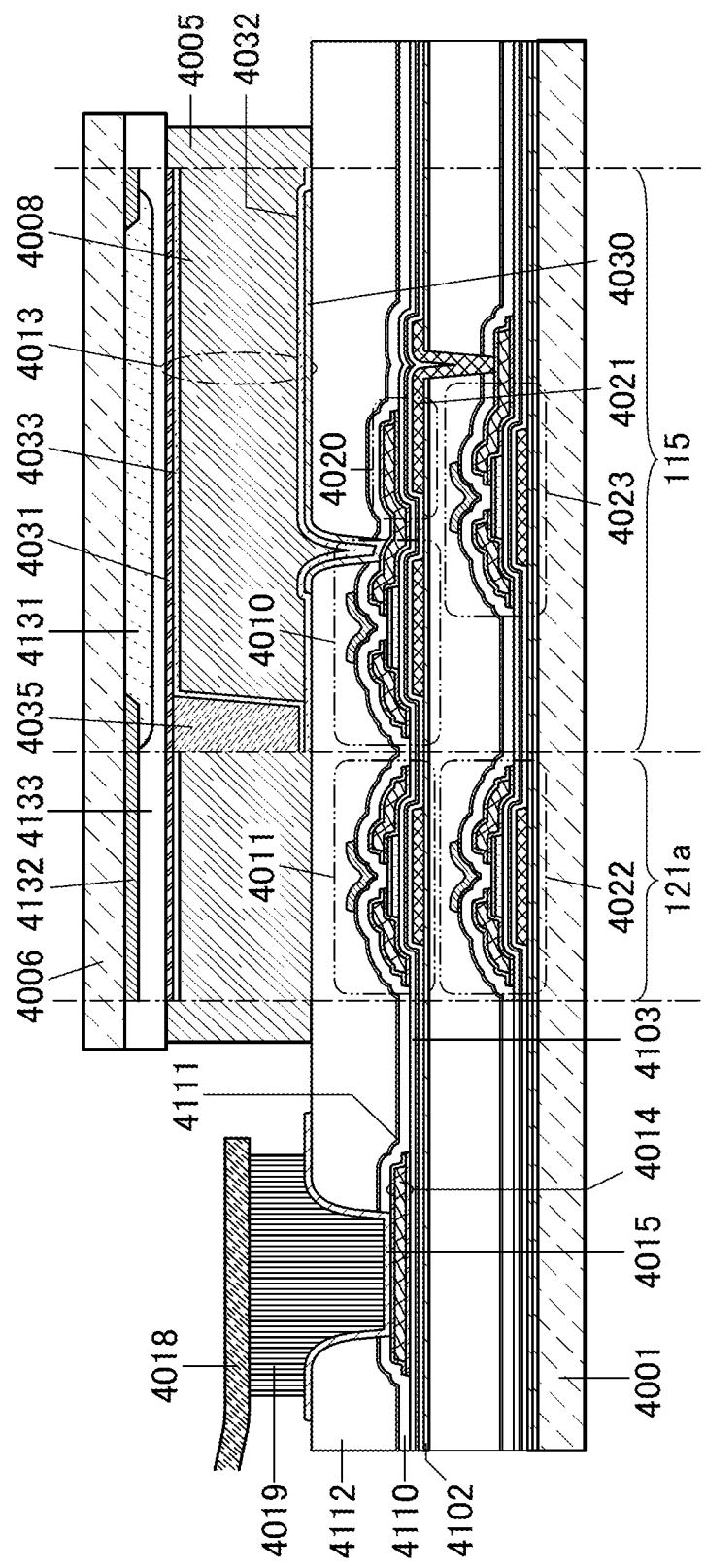
FIG. 19 is a diagram illustrating a display device.

Note that as illustrated in FIG. 19, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although FIG. 19 illustrates an example in which the stacked structure is employed for the liquid crystal display device illustrated in FIG. 18(A), the stacked structure may be employed for the EL display device illustrated in FIG. 18(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

<Bottom-Gate Transistor>

FIG. 20(A1) is a cross-sectional view of a channel-protective transistor 810, which is a type of bottom-gate transistor, in the channel length direction. In FIG. 20(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 also includes an electrode 744a and an electrode 744b which are over the insulating layer 726 and partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 shown in FIG. 20(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potentials of the electrode 746 and the electrode 723 to the same potential, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 20(B1) is a cross-sectional view of a channel-protective transistor 820, which has a structure different from that of FIG. 20(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 shown in FIG. 20(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 20(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 shown in FIG. 20(C2) is different from the transistor 825 in that the electrode 723 that can function as a back gate electrode is provided over the insulating layer 729.

FIG. 21(A1) to FIG. 21(C2) are cross-sectional views of the transistors 810, 811, 820, 821, 825, and 826 in the channel width direction, respectively.

In each of the structures shown in FIG. 21(B2) and FIG. 21(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which enables the transistor to have an improved current drive capability and high on-state current characteristics. In addition, the transistor can be miniaturized because the on-state current can be increased. The S-channel structure can also increase the mechanical strength of the transistor.

<Top-Gate Transistor>

A transistor 842 shown in FIG. 22(A1) is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. An LDD (Lightly Doped Drain) region is formed in the region of the semiconductor layer 742 that does not overlap with the electrode 746.

A transistor 843 shown in FIG. 22(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 shown in FIG. 22(B1) and a transistor 845 shown in FIG. 22(B2), the insulating layer 726 in a region that does not overlap with the electrode 746 may be completely removed. Alternatively, as in a transistor 846 shown in FIG. 22(C1) and a transistor 847 shown in FIG. 22(C2), the insulating layer 726 may be left.

Also in the transistor 842 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 23(A1) to FIG. 23(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 24(A) to FIG. 24(F) show specific examples of such electronic devices.

Figure 24A:
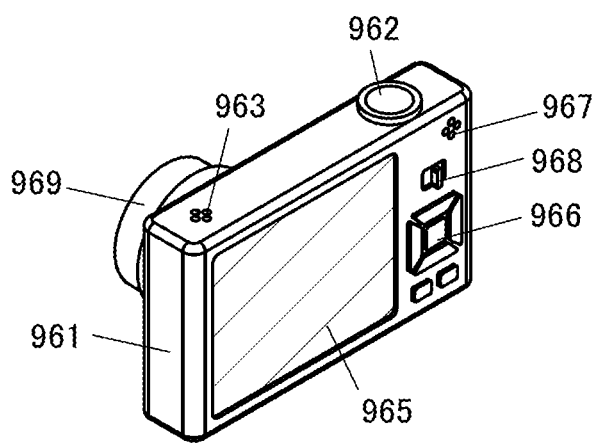
FIGS. 24A-24F are diagrams illustrating electronic devices.

FIG. 24(A) shows a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 24B:
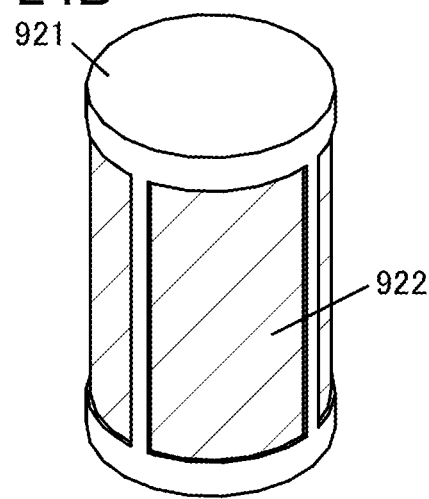

FIG. 24(B) shows a digital signage, which has large display portions 922. The digital signage can be installed on the side surface of a pillar 921, for example. The use of the display device of one embodiment of the present invention for the display portion 922 enables display with high quality.

Figure 24C:
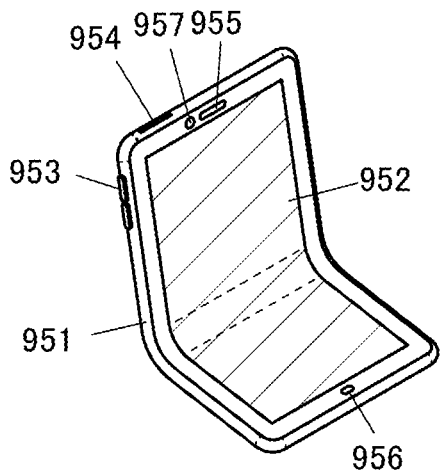

FIG. 24(C) shows a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as shown in the figure. The use of the display device of one embodiment of the present invention for the display portion 952 enables display of a variety of images.

Figure 24D:
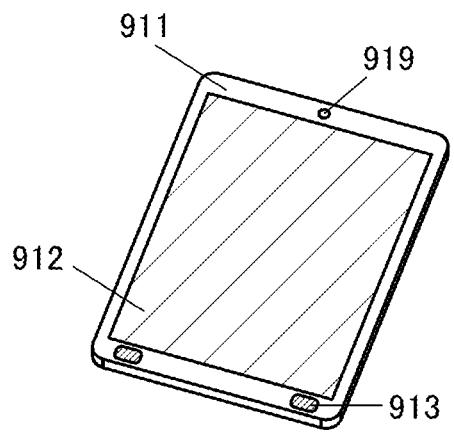

FIG. 24(D) shows a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

Figure 24E:
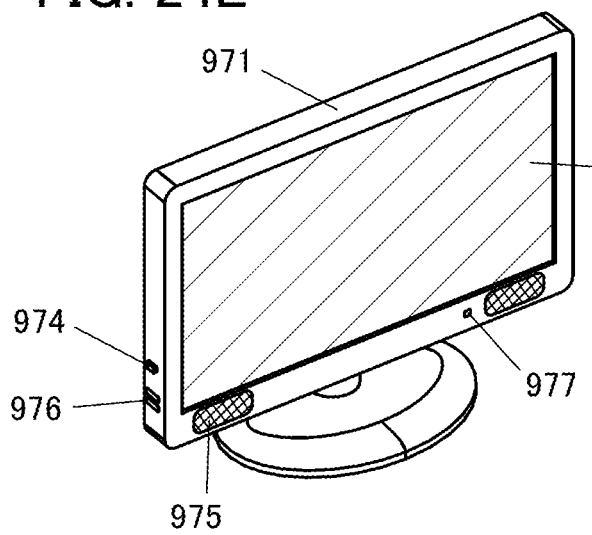

FIG. 24(E) shows a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 24F:
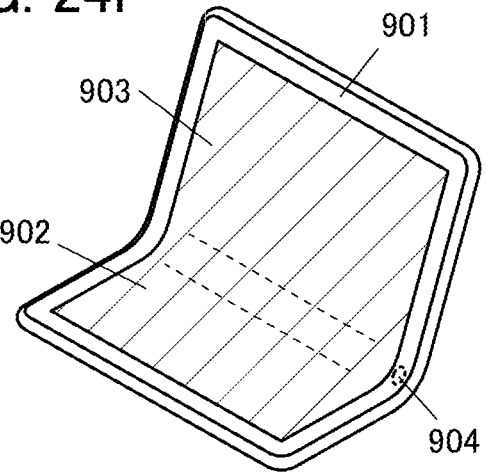

FIG. 24(F) shows an information processing terminal, which includes a housing 901, a display portion 902, a display portion 903, a sensor 904, and the like. The display portion 902 and the display portion 903 are formed using one display panel and flexible. The housing 901 is also flexible, can be used in a bent state as shown in the figure, and can be used in a flat plate shape like a tablet terminal. The sensor 904 can sense the shape of the housing 901, and it is possible to switch display on the display portion 902 and the display portion 903 when the housing is bent, for example. The use of the display device of one embodiment of the present invention for the display portion 902 and the display portion 903 enables display of a variety of images.

This embodiment can be implemented in combination with any of the structures described in the other embodiments and the like, as appropriate.

REFERENCE NUMERALS

10: pixel circuit, 10B: subpixel circuit, 10G: subpixel circuit, 10R: subpixel circuit, 11: pixel circuit, 13: row driver, 14: column driver, 15: circuit, 16: selection circuit, 17: pixel array, 20: shift register, 21: buffer circuit, 22: shift register, 23: buffer circuit, 24: sensor, 25: circuit, 26B: electrode, 26G: electrode, 26R: electrode, 31: pixel, 31B: subpixel, 31G: subpixel, 31R: subpixel, 101a: transistor, 101b: transistor, 103a: transistor, 103b: transistor, 104a: capacitor, 104b: capacitor, 110a: circuit block, 110b: circuit block, 111: transistor, 112: transistor, 113: capacitor, 114: EL element, 115: transistor, 116: capacitor, 116a: capacitor, 116b: capacitor, 117: liquid crystal element, 117a: liquid crystal element, 117b: liquid crystal element, 118: transistor, 119: transistor, 120: circuit, 121: wiring, 122: wiring, 123: wiring, 124: wiring, 125: wiring, 126: wiring, 128: wiring, 129: wiring, 130: wiring, 131: wiring, 132: wiring, 133: wiring, 134: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition wall, 4511: light-emitting layer, 4513: light-emitting element, 4514: filler.

This application is based on Japanese Patent Application Serial No. 2017-245985 filed with Japan Patent Office on Dec. 22, 2017, the entire contents of which are hereby incorporated herein by reference.

The invention claimed is:

1. A display device comprising a first pixel circuit, a second pixel circuit, a first wiring, a second wiring, a third wiring, a fourth wiring, a fifth wiring and a sixth wiring,
   wherein the first pixel circuit comprises a first transistor, a second transistor, a first capacitor, and a first circuit block,
   wherein the second pixel circuit comprises a third transistor, a fourth transistor, a second capacitor, and a second circuit block,
   wherein one of a source and a drain of the first transistor is electrically connected to one electrode of the first capacitor,
   wherein the other electrode of the first capacitor is electrically connected to one of a source and a drain of the second transistor,
   wherein the one of the source and the drain of the second transistor is electrically connected to the first circuit block,
   wherein one of a source and a drain of the third transistor is electrically connected to one electrode of the second capacitor,
   wherein the other electrode of the second capacitor is electrically connected to one of a source and a drain of the fourth transistor, wherein the one of the source and the drain of the fourth transistor is electrically connected to the second circuit block, wherein a gate of the second transistor and a gate of the fourth transistor are electrically connected to the first wiring, wherein a gate of the first transistor is electrically connected to the second wiring, wherein a gate of the third transistor is electrically connected to the third wiring, wherein the other of the source and the drain of the second transistor is electrically connected to the fourth wiring, wherein the other of the source and the drain of the first transistor and the other of the source and the drain of the third transistor are electrically connected to the fifth wiring, wherein the other of the source and the drain of the fourth transistor is electrically connected to the sixth wiring, wherein the first circuit block comprises a first display element, and wherein the second circuit block comprises a second display element.

2. The display device according to claim 1, wherein the first circuit block comprises a fifth transistor, a sixth transistor, a third capacitor, and a first organic EL element as the first display element, wherein the second circuit block comprises a seventh transistor, an eighth transistor, a fourth capacitor, and a second organic EL element as the second display element, wherein one electrode of the first organic EL element is electrically connected to one of a source and a drain of the sixth transistor, wherein the other of the source and the drain of the sixth transistor is electrically connected to one electrode of the third capacitor, wherein the one electrode of the third capacitor is electrically connected to one of a source and a drain of the fifth transistor, wherein a gate of the fifth transistor is electrically connected to the other electrode of the third capacitor, wherein the other electrode of the third capacitor is electrically connected to the other electrode of the first capacitor, wherein one electrode of the second organic EL element is electrically connected to one of a source and a drain of the eighth transistor, wherein the other of the source and the drain of the eighth transistor is electrically connected to one electrode of the fourth capacitor, wherein the one electrode of the fourth capacitor is electrically connected to one of a source and a drain of the seventh transistor, wherein a gate of the seventh transistor is electrically connected to the other electrode of the fourth capacitor, and wherein the other electrode of the fourth capacitor is electrically connected to the other electrode of the second capacitor.

3. The display device according to claim 1, wherein the first circuit block comprises a ninth transistor, a fifth capacitor, and a first liquid crystal element as the first display element, wherein the second circuit block comprises a tenth transistor, a sixth capacitor, and a second liquid crystal element as the second display element, wherein one electrode of the first liquid crystal element is electrically connected to one electrode of the fifth capacitor, wherein the one electrode of the fifth capacitor is electrically connected to one of a source and a drain of the ninth transistor, wherein the other of the source and the drain of the ninth transistor is electrically connected to the other electrode of the first capacitor, wherein one electrode of the second liquid crystal element is electrically connected to one electrode of the sixth capacitor, wherein the one electrode of the sixth capacitor is electrically connected to one of a source and a drain of the tenth transistor, and wherein the other of the source and the drain of the tenth transistor is electrically connected to the other electrode of the second capacitor.

4. The display device according to claim 1, wherein the second transistor comprises a metal oxide in a channel formation region, wherein the metal oxide comprises In, Zn and M, and wherein M is any one of Al, Ti, Ga, Sn, Y, Zr, La, Ce, Nd and Hf.

5. An electronic device comprising:
the display device according to claim 1; and
a camera.

6. The display device according to claim 1, wherein one electrode of the first display element is electrically connected to the one of the source and the drain of the second transistor and the other electrode of the first capacitor, and wherein one electrode of the second display element is electrically connected to the one of the source and the drain of the fourth transistor and the other electrode of the second capacitor.

7. The display device according to claim 6, wherein each of the second transistor and the fourth transistor comprises a metal oxide in a channel formation region, and wherein each of the first transistor and the third transistor comprises silicon in a channel formation region.

8. A display device comprising a first pixel circuit, a second pixel circuit, a first wiring, a second wiring, a third wiring, a fourth wiring, a fifth wiring, and a sixth wiring, wherein the first pixel circuit comprises a first transistor, a second transistor, a first capacitor, and a first circuit block, wherein the second pixel circuit comprises a third transistor, a fourth transistor, a second capacitor, and a second circuit block, wherein one of a source and a drain of the first transistor is electrically connected to one electrode of the first capacitor, wherein the other electrode of the first capacitor is electrically connected to one of a source and a drain of the second transistor, wherein the one of the source and the drain of the second transistor is electrically connected to the first circuit block, wherein one of a source and a drain of the third transistor is electrically connected to one electrode of the second capacitor, wherein the other electrode of the second capacitor is electrically connected to one of a source and a drain of the fourth transistor,

37 wherein the one of the source and the drain of the fourth transistor is electrically connected to the second circuit block, wherein a gate of the second transistor is electrically connected to the first wiring, wherein a gate of the fourth transistor is electrically connected to the second wiring, wherein a gate of the first transistor and a gate of the third transistor are electrically connected to the third wiring, wherein the other of the source and the drain of the first transistor is electrically connected to the fourth wiring, wherein the other of the source and the drain of the second transistor and the other of the source and the drain of the fourth transistor are electrically connected to the fifth wiring, wherein the other of the source and the drain of the third transistor is electrically connected to the sixth wiring, wherein the first circuit block comprises a fifth transistor, a sixth transistor, a third capacitor, and a first display element, wherein the second circuit block comprises a seventh transistor, an eighth transistor, a fourth capacitor, and a second display element, wherein one electrode of the first display element is electrically connected to one of a source and a drain of the sixth transistor, wherein the other of the source and the drain of the sixth transistor is electrically connected to one electrode of the third capacitor, wherein the one electrode of the third capacitor is electrically connected to one of a source and a drain of the fifth transistor, wherein a gate of the fifth transistor is electrically connected to the other electrode of the third capacitor, wherein the other electrode of the third capacitor is electrically connected to the other electrode of the first capacitor, wherein one electrode of the second display element is electrically connected to one of a source and a drain of the eighth transistor, wherein the other of the source and the drain of the eighth transistor is electrically connected to one electrode of the fourth capacitor, wherein the one electrode of the fourth capacitor is electrically connected to one of a source and a drain of the seventh transistor, wherein a gate of the seventh transistor is electrically connected to the other electrode of the fourth capacitor, and wherein the other electrode of the fourth capacitor is electrically connected to the other electrode of the second capacitor.

9. The display device according to claim 8, wherein one electrode of the first display element is electrically connected to the one of the source and the drain of the second transistor and the other electrode of the first capacitor, and wherein one electrode of the second display element is electrically connected to the one of the source and the drain of the fourth transistor and the other electrode of the second capacitor.

10. The display device according to claim 9, wherein each of the second transistor and the fourth transistor comprises a metal oxide in a channel formation region, and wherein each of the first transistor and the third transistor comprises silicon in a channel formation region.

38

11. The display device according to claim 8, wherein the second transistor comprises a metal oxide in a channel formation region, and wherein the metal oxide comprises In, Zn and M, and wherein M is any one of Al, Ti, Ga, Sn, Y, Zr, La, Ce, Nd and Hf.

12. An electronic device comprising:

the display device according to claim 8; and a camera.

13. The display device according to claim 8, wherein each of the first display element and the second display element is an organic EL element.

14. A display device comprising a first pixel circuit, a second pixel circuit, a first wiring, a second wiring, a third wiring, a fourth wiring, a fifth wiring, and a sixth wiring, wherein the first pixel circuit comprises a first transistor, a second transistor, a first capacitor, and a first circuit block, wherein the second pixel circuit comprises a third transistor, a fourth transistor, a second capacitor, and a second circuit block, wherein one of a source and a drain of the first transistor is electrically connected to one electrode of the first capacitor, wherein the other electrode of the first capacitor is electrically connected to one of a source and a drain of the second transistor, wherein the one of the source and the drain of the second transistor is electrically connected to the first circuit block, wherein one of a source and a drain of the third transistor is electrically connected to one electrode of the second capacitor, wherein the other electrode of the second capacitor is electrically connected to one of a source and a drain of the fourth transistor, wherein the one of the source and the drain of the fourth transistor is electrically connected to the second circuit block, wherein a gate of the second transistor is electrically connected to the first wiring, wherein a gate of the fourth transistor is electrically connected to the second wiring, wherein a gate of the first transistor and a gate of the third transistor are electrically connected to the third wiring, wherein the other of the source and the drain of the first transistor is electrically connected to the fourth wiring, wherein the other of the source and the drain of the second transistor and the other of the source and the drain of the fourth transistor are electrically connected to the fifth wiring, wherein the other of the source and the drain of the third transistor is electrically connected to the sixth wiring, wherein the first circuit block comprises a fifth transistor, a third capacitor and a first display element, wherein the second circuit block comprises a sixth transistor, a fourth capacitor, and a second display element, wherein one electrode of the first display element is electrically connected to one electrode of the third capacitor, wherein the one electrode of the third capacitor is electrically connected to one of a source and a drain of the fifth transistor, wherein the other of the source and the drain of the fifth transistor is electrically connected to the other electrode of the first capacitor, wherein one electrode of the second display element is electrically connected to one electrode of the fourth capacitor, wherein the one electrode of the fourth capacitor is electrically connected to one of a source and a drain of the sixth transistor, and wherein the other of the source and the drain of the sixth transistor is electrically connected to the other electrode of the second capacitor.

15. The display device according to claim 14, wherein each of the first display element and the second display element is a liquid crystal element.

16. The display device according to claim 14, wherein the second transistor comprises a metal oxide in a channel formation region.

17. The display device according to claim 14, wherein each of the second transistor and the fourth transistor comprises a metal oxide in a channel formation region, and wherein each of the first transistor and the third transistor comprises silicon in a channel formation region.

18. An electronic device comprising:

the display device according to claim 14; and a camera.

* * * * *